US012620777B2

(12) United States Patent
Iwahama et al.

(10) Patent No.: US 12,620,777 B2
(45) Date of Patent: May 5, 2026

(54) OPTICAL MEMBER, LASER MODULE INCLUDING SAID OPTICAL MEMBER, AND LASER DEVICE

(71) Applicant: Daicel Corporation, Osaka (JP)

(72) Inventors: Takahiro Iwahama, Tokyo (JP); Takeshi Fujikawa, Tokyo (JP); Sadayuki Fukui, Tokyo (JP)

(73) Assignee: Daicel Corporation, Osaka (JP)

( * ) Notice: Subject to any disclaimer, the term of this patent is extended or adjusted under 35 U.S.C. 154(b) by 0 days.

(21) Appl. No.: 18/520,457

(22) Filed: Nov. 27, 2023

(65) Prior Publication Data

US 2024/0097402 A1 Mar. 21, 2024

Related U.S. Application Data

(63) Continuation of application No. 17/872,259, filed on Jul. 25, 2022, now Pat. No. 11,862,936, which is a (Continued)

(30) Foreign Application Priority Data

Nov. 13, 2018 (JP) ................................ 2018-213241
Aug. 19, 2019 (JP) ................................ 2019-150039

(51) Int. Cl.
*H01S 5/183* (2006.01)
*B41F 15/08* (2006.01)
(Continued)

(52) U.S. Cl.
CPC .............. *H01S 5/183* (2013.01); *B41F 15/08* (2013.01); *B41J 2/01* (2013.01); *G01S 7/481* (2013.01); *G01S 17/894* (2020.01); *H01S 5/0239* (2021.01)

(58) Field of Classification Search
CPC ........ H01S 5/183; H01S 5/0239; B41F 15/08; B41J 2/01; G01S 7/481; G01S 17/894
See application file for complete search history.

(56) References Cited

U.S. PATENT DOCUMENTS 6,859,326 B2 2/2005 Sales
9,273,846 B1 3/2016 Rossi et al.
(Continued)

FOREIGN PATENT DOCUMENTS

CN 101123341 A 2/2008
CN 102736139 A 10/2012
(Continued)

OTHER PUBLICATIONS

International Search Report issued in corresponding International Patent Application No. PCT/JP2019/044328 dated Jan. 28, 2020.
(Continued)

*Primary Examiner* — Yuanda Zhang
(74) *Attorney, Agent, or Firm* — Morgan, Lewis & Bockius LLP

(57) ABSTRACT

The present disclosure provides an optical member for use in a laser module that includes a surface emitting laser, the optical member being capable of detecting damage (cracking, peeling, and the like), a method for manufacturing the optical member, a laser module including the optical member, and a laser device.

20 Claims, 4 Drawing Sheets

Related U.S. Application Data continuation of application No. 17/133,802, filed on Dec. 24, 2020, now Pat. No. 11,404,847, which is a continuation of application No. PCT/JP2019/044328, filed on Nov. 12, 2019.

(51) Int. Cl.

| | |
|---|---|
| ***B41J 2/01*** | (2006.01) |
| ***G01S 7/481*** | (2006.01) |
| ***G01S 17/894*** | (2020.01) |
| ***H01S 5/0239*** | (2021.01) |

(56) References Cited

U.S. PATENT DOCUMENTS

| | | | | |
|---|---|---|---|---|
| 9,316,798 | B2 | 4/2016 | Katou et al. | |
| 9,335,619 | B2 | 5/2016 | Ogura | |
| 10,599,022 | B2 | 3/2020 | Hanashima | |
| 10,667,341 | B1 | 5/2020 | Kriman et al. | |
| 10,935,193 | B2 | 3/2021 | Vogt et al. | |
| 11,404,847 | B2 | 8/2022 | Iwahama et al. | |
| 2004/0130790 | A1 | 7/2004 | Sales | |
| 2008/0291359 | A1 | 11/2008 | Miyashita | |
| 2009/0296762 | A1 | 12/2009 | Yamaguchi | |
| 2012/0257292 | A1 | 10/2012 | Lu | |
| 2013/0272663 | A1 | 10/2013 | Katou et al. | |
| 2015/0085262 | A1 | 3/2015 | Ogura | |
| 2015/0308671 | A1 | 10/2015 | Tischler et al. | |
| 2017/0184954 | A1 | 6/2017 | Koyanagi et al. | |
| 2017/0331064 | A1 | 11/2017 | Trummer-Sailer et al. | |
| 2017/0353004 | A1 | 12/2017 | Chen et al. | |
| 2018/0119897 | A1 | 5/2018 | Vogt et al. | |
| 2018/0203334 | A1 | 7/2018 | Hanashima | |
| 2018/0233643 | A1* | 8/2018 | Wu | H01L 33/483 |
| 2018/0267214 | A1 | 9/2018 | Rossi et al. | |
| 2019/0119519 | A1 | 4/2019 | Watanabe | |
| 2019/0123213 | A1 | 4/2019 | Yu et al. | |
| 2019/0146319 | A1 | 5/2019 | Stapleton et al. | |
| 2019/0229244 | A1 | 7/2019 | Butendeich et al. | |
| 2019/0296522 | A1 | 9/2019 | Johnson et al. | |
| 2019/0378866 | A1 | 12/2019 | Lin et al. | |

FOREIGN PATENT DOCUMENTS

| | | | | |
|---|---|---|---|---|
| CN | 103270444 | A | 8/2013 | |
| JP | H05-134150 | A | 5/1993 | |
| JP | 2005-340770 | A | 12/2005 | |
| JP | 2006-500621 | A | 1/2006 | |
| JP | 2006-202998 | A | 8/2006 | |
| JP | 2009-169140 | A | 7/2009 | |
| JP | 2015-060159 | A | 3/2015 | |
| JP | 2017-026662 | A | 2/2017 | |
| JP | 2017-211466 | A | 11/2017 | |
| JP | 2018-511034 | A | 4/2018 | |
| JP | 2018-528576 | A | 9/2018 | |
| JP | 2018-160395 | A | 10/2018 | |
| JP | 2008-281648 | A | 11/2018 | |
| TW | I671966 | A | 9/2019 | |
| TW | I671966 | B | 9/2019 | |
| TW | 202017270 | A | 5/2020 | |
| WO | 2016/052359 | A1 | 4/2016 | |
| WO | 2016/080201 | A1 | 5/2016 | |
| WO | 2017/175661 | A1 | 10/2017 | |
| WO | WO-2018043096 | A1 * | 3/2018 | H01L 23/04 |
| WO | 202003877 | A1 | 1/2020 | |

OTHER PUBLICATIONS

International Preliminary Report on Patentability and Written Opinion issued in corresponding International Patent Application No. PCT/JP2019/044328 dated May 27, 2021.

Office Action issued in counterpart Japanese Patent Application No. 2022-123551 dated Apr. 25, 2023.

Office Action issued in the counterpart TW Application No. 113104755, dated Sep. 24, 2024.

* cited by examiner

OPTICAL MEMBER, LASER MODULE INCLUDING SAID OPTICAL MEMBER, AND LASER DEVICE

TECHNICAL FIELD

The present invention relates to an optical member for use in a laser module including a surface emitting laser light source, a method for manufacturing the same, a laser module including the optical member, and a laser device. The present application claims the rights of priority to JP 2018-213241 filed in Japan on Nov. 13, 2018, and JP 2019-150039 filed in Japan on Aug. 19, 2019, the content of which is incorporated herein.

BACKGROUND ART

The demand for 3D sensing for recognizing the three-dimensional shape of an object, such as face authentication for avoidance of security risks associated with the popularization of smartphones, a recognition camera for 3D mapping, a gesture recognition controller for a gaming device, automatic driving of an automobile, and machine vision in a plant, has rapidly increased in recent years. Such 3D sensing employs a Time of Flight (TOF) method, a structured light method, and the like. In these methods, laser light is emitted to an object from a laser light source such as a Vertical Cavity Surface Emitting Laser (VCSEL) to obtain information from reflected light.

In such 3D sensing, depending on the application and purpose thereof, laser light is controlled and shaped using an optical member including an optical element such as a diffuser, a diffractive optical element, a lens, a prism, a polarizing plate, or the like. For example, in the TOF method, a diffuser is used as an optical element for attaining uniform laser light, and in the structured light method, laser light is controlled and shaped into structured light of a dot pattern or the like using a diffractive optical element (for example, Patent Documents 1 to 3).

CITATION LIST

Patent Document

Patent Document 1: JP 2017-26662 A
Patent Document 2: JP 2018-511034 T
Patent Document 3: JP 2006-500621 T

SUMMARY OF INVENTION

Technical Problem

In 3D sensing, near infrared radiation at 850 nm and 940 nm, which has relatively high safety, is often used as the laser light. However, high power light, such as laser light, may be emitted directly to the eyes in the case of face authentication of a smartphone, which can lead to harm, such as blindness. An optical member including a diffuser, a diffractive optical element, or the like diffuses the laser light, and thus also serves to reduce such harm. However, in cases where damage such as cracking or peeling occurs in the optical member due to a drop, impact, or the like, the laser light that has not been diffused is directly emitted to the eyes. Also, if the optical member is degraded or damaged in a 3D sensing system used outdoors and thus in a harsh environment such as sunlight, vibration, or the like, for example, in the case of automatic driving of an automobile, accidents may occur due to erroneous actuation, and such defects need to be detected quickly. However, in known 3D sensing systems, the means for detecting damage to the optical member is not known, and it is a current situation that the optical member continues to be used without such damage being found.

Therefore, an object of the present invention is to provide an optical member for use in a laser module including a surface emitting laser, the optical member being capable of detecting damage (cracking, peeling, and the like), and a method for manufacturing the optical member.

Another object of the present invention is to provide a laser module including the optical member.

Yet another object of the present invention is to provide a laser device including the laser module.

Note that the laser module typically undergoes a reflow process for bonding an electrode to a wiring board by soldering. In recent years, high melting point lead-free solder has been used as the solder as a bonding material, and heating treatment in the reflow process has become higher in temperature (for example, a peak temperature of from 240 to 260° C.). In such a situation, a problem has occurred in known laser modules, such as the occurrence of cracking in optical members including an optical element such as a microlens array, a diffractive optical element, or the like, due to heat treatment in the reflow process. Therefore, the optical member used in the laser module is required to have excellent heat resistance, in particular, a property of being not prone to cracking or peeling even when heat treated in the reflow process.

Solution to Problem

As a result of diligent research to solve the problems described above, the present inventors have discovered that damage to an optical member can be detected by applying a wire containing an electrically conductive substance on an optical member used in a laser module, and monitoring a conducting state of the wire. It has also been discovered that the wire can be easily and efficiently formed by applying an ink containing an electrically conductive substance to the optical member using a printing process. The present invention was completed based on these findings.

Specifically, the present invention provides an optical member for use in a laser module that includes a surface emitting laser light source, the optical member including a wire containing an electrically conductive substance.

In the optical member, the electrically conductive substance may include a metal.

In the optical member, the electrically conductive substance may include silver.

The optical member may include at least one type of optical element selected from the group consisting of a diffractive optical element and a microlens array.

The optical member may be plastic or a laminate of plastic and inorganic glass.

The plastic may be a cured product of a curable epoxy resin composition.

The present invention also provides a laser module including the optical member and a surface emitting laser light source.

The laser module further includes a conduction detection mechanism for detecting a conducting state of the wire containing the electrically conductive substance, which is included in the optical member.

The present invention also provides a laser device including the laser module.

The present invention also provides a method for manufacturing the optical member, including applying an ink containing an electrically conductive substance to an optical member by a printing process to form the wire.

In the method for manufacturing the optical member, the printing process may include inkjet printing or screen printing.

In the method for manufacturing the optical member, the optical member may be an optical element array in which two or more optical elements are arranged two-dimensionally.

The method for manufacturing the optical member may further include singulating the optical element array into the two or more optical elements by dicing.

Advantageous Effects of Invention

The optical member of the present invention has the configuration described above, and thus can easily detect damage such as cracking, peeling, and the like of the optical member used in the laser module. Therefore, defects of the laser module caused by damage to the optical member and injuries caused by erroneous actuation can be prevented. For example, in face authentication of a smartphone, attention can be attracted by sending an error message to the user, or the laser light itself is not emitted, thereby preventing the user's eyes from being directly irradiated with the laser light and reducing a risk of blindness and the like. Also, in automatic driving of an automobile, defects in a 3D sensing system mounted with the laser module are detected, and error messages or the like are sent to the driver, thereby making it possible to prevent accidents caused by erroneous actuation. In addition, the wire containing an electrically conductive substance can be easily and efficiently formed in the optical member of the present invention by an existing printing process.

BRIEF DESCRIPTION OF DRAWINGS

FIG. 1, diagram (a) is a perspective view, FIG. 1, diagram (b) is a top view, and FIG. 1, diagram (c) is a side view.

FIG. 2, diagram (a) is a top view, and FIG. 2, diagram (b) is a cross-sectional view taken along X-X'.

FIG. 3, diagram (a) is a perspective view, and FIG. 3, diagram (b) is a cross-sectional view taken along Y-Y' and Z-Z'.

DESCRIPTION OF EMBODIMENTS

Optical Member

Figure 1:
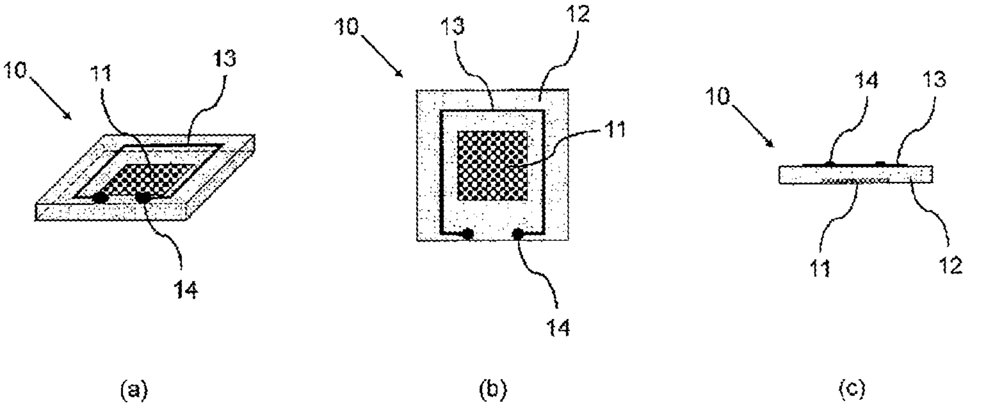
FIG. 1, diagrams (a), (b), and (c) are schematic diagrams illustrating an example of a preferred embodiment of the optical member of the present invention.

The optical member according to an embodiment of the present invention is an optical member for use in a laser module that includes a surface emitting laser light source, in which the optical member includes a wire containing an electrically conductive substance.

Any material that can be used in the optical field can be adopted, without particular limitation, as the material constituting the optical member according to an embodiment of the present invention. For example, plastic, optical glass such as BK7 or SF2, quartz glass such as synthetic quartz, or inorganic glass such as calcium fluoride crystals can be used. Among these, an optical member formed from plastic that is easily molded and processed is preferred.

Furthermore, from the perspective of providing superior heat resistance that does not easily cause cracking or peeling even during heat treatment in the reflow process, the optical member is also preferably an optical member formed from a hybrid material that is a laminate of plastic and inorganic glass (hereinafter, also referred to as "hybrid optical member"). The hybrid optical member is not particularly limited as long as it has a laminate structure of plastic and inorganic glass, and examples thereof include a laminate of a plastic layer on one or both sides of a substrate formed from inorganic glass on which an optical element is formed; and a laminate in which a plastic layer on which an optical element is formed is laminated on one or both side of a substrate made of flat inorganic glass on which no optical element is formed. The hybrid optical member is preferably a laminate in which a plastic layer on which an optical element is formed on one side of a substrate made of flat inorganic glass because the optical element is easily formed.

As the plastic that constitutes the optical member according to an embodiment of the present invention, a plastic that can be used in the optical field can be adopted without particular limitation. For example, a thermoplastic resin composition and a curable resin composition can be used. However, a curable resin composition having excellent mass productivity and moldability is preferred.

As the thermoplastic resin composition constituting the optical member according to an embodiment of the present invention, a thermoplastic resin composition that can be used in the optical field can be adopted without particular limitation, and examples thereof include (meth)acrylic resins, alicyclic structure-containing resins, styrene-based resins, polyamide resins, polycarbonate resins, polyester resins, polyether resins, urethane resins, and thiourethane resins. These thermoplastic resins can be molded into the optical member according to an embodiment of the present invention by known molding methods such as press molding, extrusion molding, and injection molding, but injection molding is preferable from the perspective of moldability and productivity.

As the curable resin composition constituting the optical member according to an embodiment of the present invention, a curable resin composition that can be used in the optical field can be adopted without particular limitation, and examples thereof include epoxy-based cationic curable resin compositions, acrylic radical curable resin compositions, and curable silicone resin compositions. Of these, an epoxy-based cationic curable resin composition (curable epoxy resin composition) that cures in a short time, has a short casting time to a mold, a small curing shrinkage rate and excellent dimensional stability, and does not undergo oxygen inhibition during curing is preferred.

As the epoxy resin, a well-known or commonly used compound having one or more epoxy groups (oxirane ring) in a molecule can be used, and examples thereof include alicyclic epoxy compounds, aromatic epoxy compounds, and aliphatic epoxy compounds. In an embodiment of the present invention, among them, in terms of being able to form a cured product with excellent heat resistance and transparency, especially, being able to form an excellent cured product that does not easily cause cracking or peeling even during heat treatment in the reflow process, a polyfunctional alicyclic epoxy compound having an alicyclic structure and two or more epoxy groups as functional groups in one molecule is preferred.

Examples of the polyfunctional alicyclic epoxy compounds specifically include:

(i) a compound having an epoxy group constituted of two adjacent carbon atoms and an oxygen atom that constitute an alicyclic ring (i.e., an alicyclic epoxy group);

(ii) a compound having an epoxy group directly bonded to an alicyclic ring with a single bond; and (iii) a compound having an alicyclic ring and a glycidyl group.

An example of the above compound (i) having an alicyclic epoxy group includes a compound represented by Formula (i) below.

[Chem. 1]

(i)

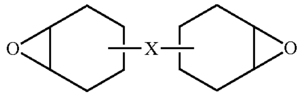

In Formula (i) above, X represents a single bond or a linking group (a divalent group having one or more atoms). Examples of the linking group include a divalent hydrocarbon group, an epoxidized alkenylene group in which carbon-carbon double bonds are partially or entirely epoxidized, a carbonyl group, an ether bond, an ester bond, a carbonate group, an amide group, and a linked group in which a plurality of the above is linked. Note that a substituent (for example, such as an alkyl group) may be bonded to a cyclohexene oxide group in Formula (i).

Examples of the divalent hydrocarbon group include a linear or branched alkylene group having from 1 to 18 carbon atoms and a divalent alicyclic hydrocarbon group. Examples of the linear or branched alkylene group having from 1 to 18 carbon atoms include a methylene group, a methylmethylene group, a dimethylmethylene group, an ethylene group, a propylene group, and a trimethylene group. Examples of the divalent alicyclic hydrocarbon group include a cycloalkylene group (including a cycloalkylidene group), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group.

Examples of the alkenylene group in the epoxidized alkenylene group in which one, some, or all carbon-carbon double bond(s) is (are) epoxidized (which may be referred to as the "epoxidized alkenylene group") include a linear or branched alkenylene group having from 2 to 8 carbon atoms, such as a vinylene group, a propenylene group, a 1-butenylene group, a 2-butenylene group, a butadienylene group, a pentenylene group, a hexenylene group, a heptenylene group, and an octenylene group. In particular, the epoxidized alkenylene group is preferably an epoxidized alkenylene group in which all of the carbon-carbon double bond(s) is/are epoxidized and more preferably an epoxidized alkenylene group having from 2 to 4 carbon atoms in which all of the carbon-carbon double bond(s) is/are epoxidized.

The linking group in the above X is, in particular, preferably a linking group containing an oxygen atom, and specifically, examples thereof include —CO—, —O—CO—O—, —COO—, —O—, —CONH—, and an epoxidized alkenylene group; a group in which a plurality of these groups are linked; and a group in which one or two or more of these groups and one or more of the divalent hydrocarbon groups are linked.

Representative examples of the compound represented by Formula (i) above include (3,4,3',4'-diepoxy)bicyclohexyl, bis(3,4-epoxycyclohexylmethyl)ether, 1,2-epoxy-1,2-bis(3,4-epoxycyclohexane-1-ypethane, 2,2-bis(3,4-epoxycyclohexane-1-yl)propane, 1,2-bis(3,4-epoxycyclohexane-1-ypethane, and compounds represented by Formulas (i-1) to (i-10) below. L in Formula (i-5) below is an alkylene group having from 1 to 8 carbons, and, among them, preferably a linear or branched alkylene group having from 1 to 3 carbons, such as a methylene group, an ethylene group, a propylene group, or an isopropylene group. In Formulas (i-5), (i-7), (i-9), and (i-10) below, $n^1$ to $n^8$ each represent an integer of 1 to 30.

[Chem. 2]

(i-1)

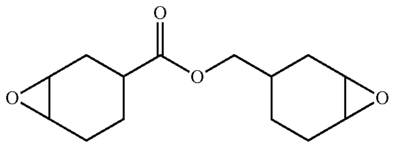

(i-2)

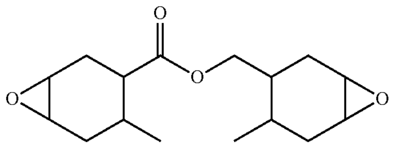

(i-3)

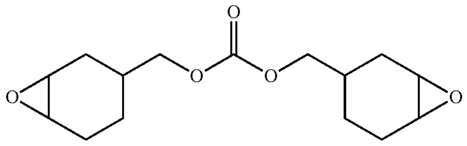

(i-4)

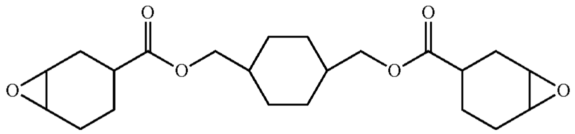

(i-5)

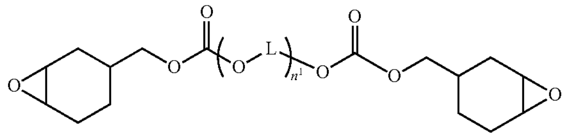

(i-6)

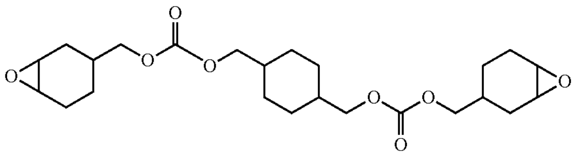

-continued (i-7)

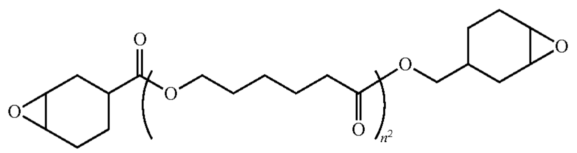

(i-8)

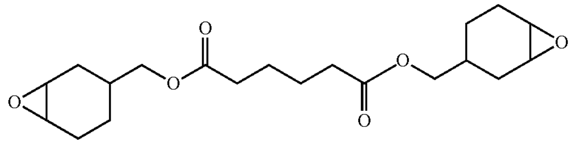

[Chem. 3]

(i-9)

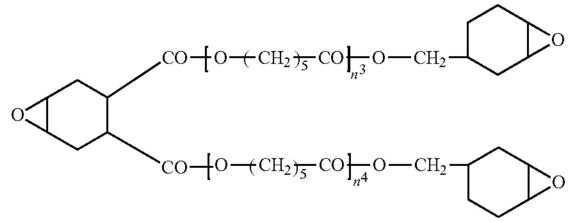

(i-10)

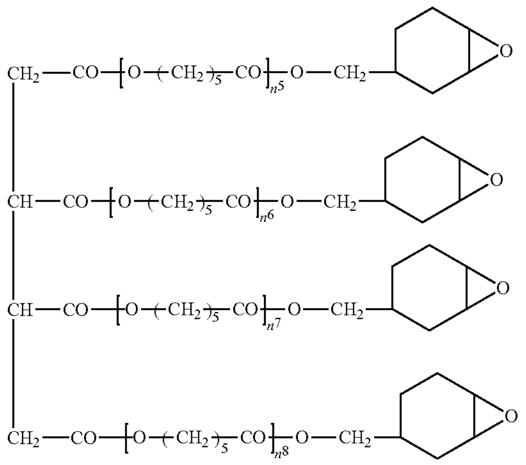

The above compound (i) having an alicyclic epoxy group also includes an epoxy-modified siloxane.

Examples of the epoxy-modified siloxane include a chain or cyclic polyorganosiloxane having a constituent unit represented by Formula (i') below.

[Chem. 4]

(i')

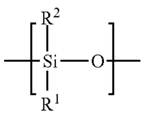

In Formula (i') above, $R^1$ represents a substituent containing an epoxy group represented by Formula (1a) or (1b) below, and $R^2$ represents an alkyl group or an alkoxy group.

[Chem. 5]

(1a)

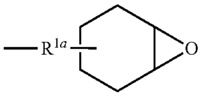

(1b)

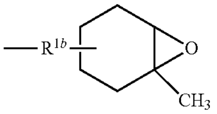

In the formulas, $R^{1a}$ and $R^{1b}$ are the same or different and represent a linear or branched alkylene group, and examples thereof include a linear or branched alkylene group having from 1 to 10 carbons, such as a methylene group, a methyl methylene group, a dimethyl methylene group, an ethylene group, a propylene group, a trimethylene group, a tetramethylene group, a pentamethylene group, a hexamethylene group, and a decamethylene group.

The epoxy equivalent (in accordance with JIS K7236) of the epoxy-modified siloxane is, for example, from 100 to 400 and preferably from 150 to 300.

As the epoxy-modified siloxane, for example, commercially available products can be used, for example, such as an epoxy-modified cyclic polyorganosiloxane represented by Formula (i'-1) below (trade name "X-40-2670", available from Shin-Etsu Chemical Co., Ltd.).

[Chem. 6]

(i'-1)

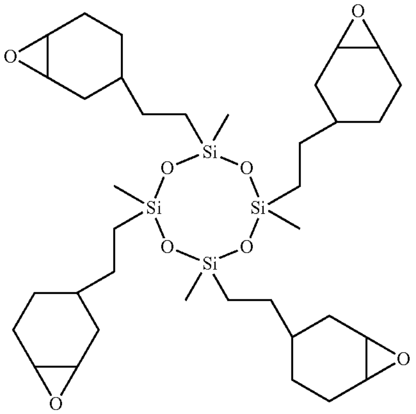

Examples of the above compound (ii) having an epoxy group directly bonded to an alicyclic ring with a single bond include a compound represented by Formula (ii) below.

[Chem. 7]

(ii)

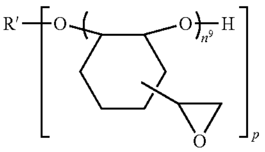

In Formula (ii), R' is a group resulting from elimination of p hydroxyl groups (—OH) from a structural formula of a p-hydric alcohol (p-valent organic group), and p and $n^9$ each represent a natural number. Examples of the p-hydric alcohol $[R'—(OH)_p]$ include polyhydric alcohols (alcohols having from 1 to 15 carbon atoms), such as 2,2-bis(hydroxymethyl)-1-butanol. Here, p is preferably from 1 to 6, and $n^9$ is preferably from 1 to 30. When p is 2 or greater, $n^9$ in each group in square brackets (the outer brackets) may be the same or different. Examples of the compound represented by Formula (ii) above specifically include 1,2-epoxy-4-(2-oxiranyl)cyclohexane adduct of 2,2-bis(hydroxymethyl)-1-butanol [for example, such as the trade name "EHPE3150" (available from Daicel Corporation)].

Examples of the above compound (iii) having an alicyclic ring and a glycidyl group include hydrogenated aromatic glycidyl ether-based epoxy compounds, such as a hydrogenated bisphenol A epoxy compound, a hydrogenated bisphenol F epoxy compound, a hydrogenated bisphenol epoxy compound, a hydrogenated phenol novolac epoxy compound, a hydrogenated cresol novolac epoxy compound, a hydrogenated cresol novolac epoxy compound of bisphenol A, a hydrogenated naphthalene epoxy compound, and a hydrogenated product of a trisphenol methane epoxy compound.

The polyfunctional alicyclic epoxy compound is preferably the compound (i) having an alicyclic epoxy group and particularly preferably a compound represented by Formula (i) above (in particular, (3,4,3',4'-diepoxy)bicyclohexyl), in terms of providing a cured product having high surface hardness and excellent transparency.

The curable resin composition in an embodiment of the present invention may contain an additional curable compound in addition to the epoxy resin as the curable compound and can contain, for example, one type, or two or more types of cationic curable compounds, such as an oxetane compound and a vinyl ether compound.

A proportion of the epoxy resin in a total amount (100 wt. %) of the curable compound contained in the curable resin composition is, for example, 50 wt. % or greater, preferably 60 wt. % or greater, particularly preferably 70 wt. % or greater, most preferably 80 wt. % or greater, and the upper limit is, for example, 100 wt. % and preferably 90 wt. %.

In addition, a proportion of the compound (i) having an alicyclic epoxy group in the total amount (100 wt. %) of the curable compound contained in the curable resin composition is, for example, 20 wt. % or greater, preferably 30 wt. % or greater, particularly preferably 40 wt. % or greater, and the upper limit is, for example, 70 wt. % and preferably 60 wt. %.

A proportion of the compound represented by Formula (i) in the total amount (100 wt. %) of the curable compound contained in the curable resin composition is, for example, 10 wt. % or greater, preferably 15 wt. % or greater, particularly preferably 20 wt. % or greater, and the upper limit is, for example, 50 wt. % and preferably 40 wt. %.

The curable resin composition preferably contains a polymerization initiator along with the curable compound, and particularly preferably contains one or more photopolymerization or thermal polymerization initiators (photocationic or thermal cationic polymerization initiators).

The photocationic polymerization initiator is a compound that initiates curing reaction of the curable compound (in particular, the cationic curable compound) contained in the curable resin composition by generating an acid with light irradiation and is formed of a cationic moiety that absorbs light and an anionic moiety that serves as a source for generating the acid.

Examples of the photocationic polymerization initiator include diazonium salt-based compounds, iodonium salt-based compounds, sulfonium salt-based compounds, phosphonium salt-based compounds, selenium salt-based compounds, oxonium salt-based compounds, ammonium salt-based compounds, and bromine salt-based compounds.

In the present invention, among these, use of a sulfonium salt-based compound is preferred because a cured product having excellent curability can be formed. Examples of the cationic moiety of the sulfonium salt-based compound include arylsulfonium ions (in particular, triarylsulfonium ions), such as a (4-hydroxyphenyl)methylbenzylsulfonium ion, a triphenyl sulfonium ion, a diphenyl[4-(phenylthio)phenyl]sulfonium ion, a 4-(4-biphenylthio)phenyl-4-biphenylylphenylsulfonium ion, and a tri-p-tolylsulfonium ion.

Examples of the anion moiety of the photocationic polymerization initiator include $[(Y)_sB(Phf)_{4-s}]^-$ (in the formula, Y represents a phenyl group or a biphenylyl group, Phf represents a substituted phenyl group in which at least one of hydrogen atoms is replaced with at least one selected from a perfluoroalkyl group, a perfluoroalkoxy group, or a halogen atom, and s is an integer of 0 to 3.), $BF_4^-$, $[(Rf)_tPF_{6-t}]^-$ (in the formula, Rf represents an alkyl group in which 80% or more of hydrogen atoms are replaced with fluorine atoms, and t represents an integer of 0 to 5; $AsF_6^-$; $SbF_6^-$; and $SbF_5OH^-$.

Examples of the photocationic polymerization initiator that can be used include (4-hydroxyphenyl)methylbenzylsulfonium tetrakis(pentafluorophenyl)borate; 4-(4-biphenylylthio)phenyl-4-biphenylylphenylsulfonium tetrakis (pentafluorophenyl)borate; 4-(phenylthio) phenyldiphenylsulfonium phenyltris(pentafluorophenyl) borate; [4-(4-biphenylylthio)phenyl]-4-biphenylylphenylsulfonium phenyltris(pentafluorophenyl) borate; diphenyl[4-(phenylthio)phenyl]sulfonium tris (pentafluoroethyl)trifluorophosphate; diphenyl[4-(phenylthio)phenyl]sulfonium tetrakis(pentafluorophenyl) borate; diphenyl[4-(phenylthio)phenyl]sulfonium hexafluorophosphate; 4-(4-biphenylylthio)phenyl-4-biphenylylphenylsulfonium tris(pentafluoroethyl)trifluorophosphate; bis[4-(diphenylsulfonio)phenyl]sulfide phenyltris (pentafluorophenyl)borate; [4-(2-thioxanthonylthio)phenyl] phenyl-2-thioxanthonylsulfonium phenyltris (pentafluorophenyl)borate; 4-(phenylthio) phenyldiphenylsulfonium hexafluoroantimonate; and commercially available products under trade names, such as "Cyracure UVI-6970", "Cyracure UVI-6974", "Cyracure UVI-6990", and "Cyracure UVI-950" (these are available from Union Carbide Corporation, USA), "Irgacure 250", "Irgacure 261", "Irgacure 264", and "CG-24-61" (these are available from BASF), "Optomer SP-150", "Optomer SP-151", "Optomer SP-170", and "Optomer SP-171" (these are available from Adeka Corporation), "DAICAT II" (available from Daicel Corporation), "UVAC 1590" and "UVAC 1591" (these are available from Daicel-Cytec Co., Ltd.), "CI-2064", "CI-2639", "CI-2624", "CI-2481", "CI-2734", "CI-2855", "CI-2823", "CI-2758", and "CIT-1682" (these are available from Nippon Soda Co., Ltd.), "PI-2074" (tetrakis(pentafluorophenyl)borate tricumyliodonium salt, available from Rhodia), "FFC 509" (available from 3M), "BBI-102", "BBI-101", "BBI-103", "MPI-103", "TPS-103", "MDS-103", "DTS-103", "NAT-103", and "NDS-103" (these are available from Midori Kagaku Co., Ltd.), "CD-1010", "CD-1011", and "CD-1012" (these are available from Sartomer, USA), and "CPI-100P" and "CPI-101A" (these are available from San-Apro Ltd.).

The thermal cationic polymerization initiator is a compound that initiates a curing reaction of the cationic curable compound contained in the curable resin composition by generating an acid with heating treatment and is formed of a cationic moiety that absorbs heat and an anionic moiety that serves as a source for generating the acid. A single thermal cationic polymerization initiator can be used alone, or two or more thermal cationic polymerization initiators can be used in combination.

Examples of the thermal cationic polymerization initiator include iodonium salt compounds, and sulfonium salt compounds.

Examples of the cationic moiety of the thermal cationic polymerization initiator include 4-hydroxyphenyl-methyl-benzylsulfonium ions, 4-hydroxyphenyl-methyl-(2-methyl-benzyl)sulfonium ions, 4-hydroxyphenyl-methyl-1-naphthylmethylsulfonium ions, and p-methoxycarbonyloxyphenyl-benzyl-methylsulfonium ions.

Examples of the anionic moiety of the thermal cationic polymerization initiator include the same examples as those of the anionic moiety of the photocationic polymerization initiator indicated above.

Examples of the thermal cationic polymerization initiator include 4-hydroxyphenyl-methyl-benzylsulfonium phenyl tris(pentafluorophenyl) borate, 4-hydroxyphenyl-methyl-(2-methylbenzyl) sulfonium phenyl tris(pentafluorophenyl) borate, 4-hydroxyphenyl-methyl-1-naphthylmethylsulfonium phenyl tris(pentafluorophenyl) borate, and p-methoxycarbonyloxyphenyl-benzyl-methylsulfonium phenyl tris (pentafluorophenyl) borate.

The content of the polymerization initiator is, for example, in a range of 0.1 to 5.0 parts by weight relative to 100 parts by weight of the curable compound (in particular, the cationic curable compound) contained in the curable resin composition. When the content of the photopolymerization initiator is less than the above range, curing failures may occur. On the other hand, when the content of the photopolymerization initiator exceeds the above range, coloration of the cured product tends to occur.

The curable resin composition in the present invention can be produced by mixing the curable compound, the polymerization initiator, and, as necessary, an additional component (for example, such as a solvent, an antioxidant, a surface conditioner, a photosensitizer, an anti-foaming agent, a leveling agent, a joining agent, a surfactant, a flame retardant, an ultraviolet absorber, and a colorant). The additional component is blended in an amount of, for example, 20 wt. % or less, preferably 10 wt. % or less, particularly preferably 5 wt. % or less of the total amount of the curable resin composition.

The viscosity of the curable resin composition of the present invention at 25° C. is not particularly limited, but is preferably 5000 mPa·s or less, more preferably 2500 mPa·s or less. Adjusting the viscosity of the curable resin composition according to an embodiment of the present invention to the above-described range may improve fluidity, and suppress air bubble residues. Thus, it is possible to fill the curable resin composition into a mold while suppressing the increase in injection pressure. That is, coatability and fillability can be improved, and workability can be improved throughout the molding operation of the curable resin composition according to an embodiment of the present invention. The viscosity in the present specification is a value measured using a rheometer ("PHYSICA UDS200" available from Paar Physica) under the conditions of a temperature of 25° C. and a rotational speed of 20/sec.

Commercially available products such as the trade names "CELVENUS OUH106" and "CELVENUS OTM107" (there are available from Daicel Corporation) can also be used as the curable resin composition in the present invention.

The optical member according to an embodiment of the present invention can obtain an optical member formed from a cured product of the curable resin composition by molding the curable resin composition using a mold and then curing.

Examples of the method for molding the curable resin composition using a mold include methods (1) and (2) below.

(1) A method of applying the curable resin composition to a mold, pressing a substrate from above, curing the curable resin composition, and then detaching the mold; and (2) A method of applying the curable resin composition to at least one of an upper mold or a lower mold, combining the upper mold and the lower mold, curing the curable resin composition, and then detaching the upper mold and the lower mold.

For example, when a photocurable resin composition is used as the curable resin composition, a substrate having a light transmittance of 90% or greater at a wavelength of 400 nm is preferably used as the substrate described above, and a substrate made of inorganic glass such as quartz glass or optical glass can be suitably used. In the method (1) above, when a substrate made of inorganic glass is used, a hybrid optical member that is a laminate of a cured product of a curable resin composition and inorganic glass can be obtained. Further, the light transmittance at the wavelength can be determined using a substrate (thickness: 1 mm) as a test piece and using a spectrophotometer to measure the light transmittance at the wavelength irradiated to the test piece.

The method of applying the curable resin composition is not particularly limited, and examples thereof include methods using a dispenser, a syringe, or the like. Furthermore, the curable resin composition is preferably applied to a center portion of the mold.

For example, when a photocurable resin composition is used as the curable resin composition, the curable resin composition can be cured by ultraviolet irradiation. Examples of the light source used during the ultraviolet light irradiation include a high-pressure mercury-vapor lamp, an ultrahigh-pressure mercury-vapor lamp, a carbon-arc lamp, a xenon lamp, and a metal halide lamp. The irradiation time is dependent of the type of the light source, the distance between the light source and the coated surface, and other conditions, but is several tens of seconds at the longest. The illuminance is approximately from 5 to 200 mW. After the ultraviolet light irradiation, the curable composition may be heated (post-curing) as necessary to facilitate curing.

For example, when a thermosetting resin composition is used as the curable resin composition, the curable resin composition can be cured by heating treatment. The heating temperature is, for example, approximately from 60 to 150° C. The heating time is, for example, approximately from 0.2 to 20 hours.

The shape of the optical member according to an embodiment of the present invention is not particularly limited as long as it can be used in the optical field, and can be selected, for example, from a plate shape, a sheet shape, a film shape, a lens shape, a prism shape, a columnar shape, a conical shape, and the like depending on the purpose and application. A substrate shape such as a plate shape, a sheet shape, a film shape, or the like is preferred from the perspective of easily controlling the laser light, when the optical member includes an optical element described below. When the optical member according to an embodiment of the present invention has a substrate shape, the thickness thereof can also be appropriately set depending on the application and purpose, and can be appropriately selected from a range of from 100 to 2000 μm, and preferably from 100 to 1000 μm.

The optical member according to an embodiment of the present invention preferably has high transparency. The total light transmittance of the optical member according to an embodiment of the present invention is not particularly limited but is preferably 70% or greater and more preferably 80% or greater. In addition, the upper limit of the total light transmittance is not particularly limited but is, for example, 99%. The total light transmittance of the optical member according to an embodiment of the present invention can be easily controlled to the above range, for example, by using the cured product of the curable resin composition described above as the material. Here, the total light transmittance can be measured according to JIS K7361-1.

The haze of the optical member according to an embodiment of the present invention is not particularly limited but is preferably 10% or less and more preferably 5% or less. In addition, the lower limit of the haze is not particularly limited but is, for example, 0.1%. The haze of the optical member according to an embodiment of the present invention can be easily controlled to the above range, for example, by using the cured product of the curable resin composition described above as the material. Here, the haze can be measured according to JIS K7136.

The optical member according to an embodiment of the present invention preferably includes an optical element. As the optical element included in the optical member according to an embodiment of the present invention, an optical element that can be used in the optical field can be adopted without particular limitation, and examples thereof include diffractive optical elements, microlens arrays, prisms, and polarizing plates. A diffractive optical element and a microlens array, which are suitable for controlling the laser light, are preferred.

The diffractive optical element (DOE) is an optical element that uses a diffraction phenomenon of light such as grating hologram to change the traveling direction of the light, which diffracts light by a periodic structure (diffraction groove) formed in the optical member and forms the light into any structural light. The structural light of the laser light that is controlled by the diffractive optical element included in the optical member according to an embodiment of the present invention is not particularly limited, but examples thereof include a dot pattern, and uniform surface irradiated light. The structural light can be appropriately selected depending on the application and purpose.

The microlens array has a structure in which a plurality of microlenses having a size of approximately tens of μm are arranged, and functions as a "diffuser" that diffuses and uniformizes the laser light emitted from the surface emitting laser light source. The respective microlenses constituting the microlens array may have the same shape, or the microlens array may have a random structure in which microlenses different in shape are arranged. Whether the microlenses have the same shape or different shapes may be appropriately selected depending on the application and purpose.

The optical element included in the optical member according to an embodiment of the present invention can be formed by a known method. For example, a mold having a molding surface having an inverted shape to the shape of a desired optical element is used as the mold for molding the curable resin composition described above, and thus the optical element can be formed in a region corresponding to the inverted shape of the optical member. Furthermore, a method of forming a desired optical pattern on the optical member by electron beam lithography or the like may also be adopted.

In addition, a member including an optical element may be separately laminated onto an optical member that does not include an optical element. A material similar to the material constituting the optical member according to an embodiment of the present invention can be used as the material constituting the member including an optical element. The material that constitutes the member including an optical element may be the same material as or a different material from the material constituting the optical member according to an embodiment of the present invention. The member including an optical element can be available from a method similar to the method for manufacturing the optical member including the optical element according to an embodiment of the present invention.

The optical element included in the optical member according to an embodiment of the present invention may be formed entirely on the surface of the optical member or may be formed partially thereon. Specifically, in a case where the optical member has a substrate shape, an optical element may be formed entirely on at least one side of the optical member, or an optical element may be formed partially thereon. Additionally, an optical element may be formed on only one side of the substrate-shaped optical member, or an optical element may be formed on both sides thereof.

An aspect is preferred in which a substrate-shaped optical member including an optical element preferably includes a region in which an optical element is formed (hereinafter, also referred to as "optical element region") and a region in which no optical element is formed (hereinafter, also referred to as "non-optical element region"). Especially, an aspect is preferred in which the optical element region is formed in a center portion of the substrate of the optical member, and the non-optical element region is provided on the periphery of the optical element region (outer periphery of the substrate of the optical member). Note that, even in a case where an optical element is formed on only one side of the substrate-shaped optical member, regions corresponding to the optical element region and the non-optical element region are also interpreted as the optical element region and the non-optical element region, respectively, on the other side on which no optical element is formed.

[Wire Containing Electrically Conductive Substance]

The optical member according to an embodiment of the present invention includes a wire containing an electrically conductive substance.

The electrically conductive substance is not particularly limited as long as it has electrical conductivity, and for example, a metal, a metal oxide, an electrically conductive polymer, an electrically conductive carbon-based substance, or the like can be used.

Examples of the metal include gold, silver, copper, chromium, nickel, palladium, aluminum, iron, platinum, molybdenum, tungsten, zinc, lead, cobalt, titanium, zirconium, indium, rhodium, ruthenium, and alloys thereof. Examples of the metal oxide include chromium oxide, nickel oxide, copper oxide, titanium oxide, zirconium oxide, indium oxide, aluminum oxide, zinc oxide, tin oxide, or composite oxides thereof such as composite oxides of indium oxide and tin oxide (ITO) and complex oxides of tin oxide and phosphorus oxide (PTO). Examples of the electrically conductive polymer include polyacetylene, polyaniline, polypyrrole, and polythiophene. Examples of the electrically conductive carbon-based substance include carbon black, SAF, ISAF, HAF, FEF, GPF, SRF, FT, MT, pyrolytic carbon, natural graphite, and artificial graphite. These electrically conductive substances can be used alone, or two or more types thereof can be used in combination.

The electrically conductive substance is preferably a metal or metal oxide having excellent electrical conductivity and easy to form a wire, and more preferably a metal. Gold, silver, copper, indium, or the like is preferred, and silver is particularly preferred because it is mutually fused at a temperature of approximately 100° C. and can form a wire with excellent electrical conductivity even on a plastic optical member.

In addition to the electrically conductive substance, the wire containing the electrically conductive substance may contain an additive such as a doping agent, a reducing agent, an antioxidant, a coupling agent (such as a silane coupling agent), or the like, from the perspective of improving electrical conductivity, steady contact with the optical member, and the like.

As a method for forming the wire containing the electrically conductive substance on the optical member, known methods such as a printing process, a sputtering method, a vacuum deposition method, a chemical vapor deposition (CVD) method, a metal organic chemical vapor deposition (MOCVD) method, and a laser ablation method (Pulsed Laser Ablation Deposition (PLAD)) can be used without limitation. From the perspective of easily forming a wire of a desired width at a target position of the optical member, a printing process and a sputtering method are preferred, and a printing process is particularly preferred.

As the printing process, a known printing process can be used without particular limitation, and examples thereof include inkjet printing, gravure printing, flexographic printing, screen printing, and offset printing. From the perspective of easily forming a wire of a desired width at a target position of the optical member, inkjet printing, gravure printing, flexographic printing, or screen printing is preferred, and inkjet printing or screen printing is particularly preferred.

The inkjet printing according to an embodiment of the present invention is a method that includes applying an ink containing an electrically conductive substance from a nozzle to an optical member to form a wire.

The ink containing the electrically conductive substance used in the inkjet printing in the present invention is not particularly limited as long as it can be used for inkjet printing, but from the perspective of easily forming a wire of a desired width at a target position of the optical member, an ink containing "surface-modified metal nanoparticles having a configuration in which surfaces of the metal nanoparticles are coated with an organic protective agent" (hereinafter, also referred to simply as "surface-modified metal nanoparticles") is preferred.

The surface-modified metal nanoparticles have a configuration in which surfaces of the metal nanoparticles are coated with an organic protective agent. As such, the surface-modified metal nanoparticles have excellent dispersibility because the spacing between the metal nanoparticles is ensured and thus agglomeration is suppressed.

The surface-modified metal nanoparticles include a metal nanoparticle portion and a surface modification portion that coats the metal nanoparticle portion (i.e., the portion that coats the metal nanoparticles and is formed of an organic protective agent), and the proportion of the surface modification portion is, for example, approximately from 1 to 20 wt. % (preferably from 1 to 10 wt. %) of the weight of the metal nanoparticle portion. Each weight of the metal nanoparticle portion and the surface modification portion in the surface-modified metal nanoparticles can be determined, for example, from the weight loss rate in a certain temperature range by subjecting the surface-modified metal nanoparticles to thermogravimetry.

The average primary particle diameter of the metal nanoparticle portion in the surface-modified metal nanoparticles is, for example, from 0.5 to 100 nm, preferably from 0.5 to 80 nm, more preferably from 1 to 70 nm, and even more preferably from 1 to 60 nm.

The metal constituting the metal nanoparticle portion of the surface-modified metal nanoparticles can be a metal having the above-described electrical conductivity, and examples thereof include gold, silver, copper, nickel, aluminum, rhodium, cobalt, and ruthenium. Silver nanoparticles are preferred as the metal nanoparticles according to an embodiment of the present invention in that the silver nanoparticles are fused to each other at a temperature of approximately 100° C., and can form a wire having excellent electrical conductivity on the optical member. Therefore, the surface-modified metal nanoparticles are preferably surface-modified silver nanoparticles, and a silver ink is preferred as the ink for inkjet printing.

The organic protective agent that constitutes the surface modification portion of the surface-modified metal nanoparticles is preferably a compound having at least one type of functional group selected from the group consisting of a carboxyl group, a hydroxyl group, an amino group, a sulfo group, and a thiol group, particularly preferably a compound having from 4 to 18 carbon atoms and having at least one type of functional group selected from the group consisting of an amino group, a sulfo group, and a thiol group, most preferably a compound having an amino group, and especially preferably a compound having from 4 to 18 carbon atoms and having an amino group (i.e., an amine having from 4 to 18 carbon atoms).

The surface-modified metal nanoparticles can be manufactured, for example, through: mixing a metal compound and an organic protective agent to form a complex containing the metal compound and the organic protective agent (formation of the complex); thermally decomposing the complex (thermal decomposition); and, as necessary, washing the reaction product (washing).

Formation of Complex

The formation of the complex is to mix a metal compound and an organic protective agent to form a complex containing the metal compound and the organic protective agent. It is preferable to use a silver compound as the metal compound, and because the nano-sized silver particles are fused to each other at a temperature of approximately 100° C., and thus a wire having excellent electrical conductivity can be formed on the optical member. Particularly, a silver compound that is readily decomposed upon heating and produces metallic silver is preferably used. Examples of such a silver compound include silver carboxylates, such as silver formate, silver acetate, silver oxalate, silver malonate, silver benzoate, and silver phthalate; silver halides, such as silver fluoride, silver chloride, silver bromide, and silver iodide; and silver sulfate, silver nitrate, and silver carbonate. Among them, silver oxalate is preferred in that it has a high silver content, can be thermally decomposed without using a reducing agent, and thus an impurity derived from the reducing agent is less likely to be mixed into the ink.

As the organic protective agent, a compound having at least one type of functional group selected from the group consisting of a carboxyl group, a hydroxyl group, an amino group, a sulfo group, and a thiol group, in that the coordination of non-covalent electron pairs in the heteroatom to the metal nanoparticles can exert an effect of strongly suppressing agglomeration between the metal nanoparticles. A compound having from 4 to 18 carbon atoms and having at least one type of functional group selected from the group consisting of a carboxyl group, a hydroxyl group, an amino group, a sulfo group, and a thiol group is particularly preferred.

The organic protective agent is preferably a compound having an amino group, and most preferably a compound having from 4 to 18 carbon atoms and having an amino group, that is, an amine having from 4 to 18 carbon atoms.

The amine is a compound in which at least one hydrogen atom of ammonia is substituted with a hydrocarbon group, and includes a primary amine, a secondary amine, and a tertiary amine. In addition, the amine may be a monoamine or a polyamine, such as a diamine. One of these solvents can be used alone or two or more in combination.

The amine preferably contains at least one selected from a monoamine (1) having 6 or more carbon atoms in total and represented by Formula (a-1) below, where $R^1$, $R^2$, and $R^3$ are identical or different and are hydrogen atoms or monovalent hydrocarbon groups (with the provisio that the case in which $R^1$, $R^2$, and $R^3$ are all hydrogen atoms is omitted); monoamine (2) having 5 or less carbon atoms in total and represented by Formula (a-1) below, where $R^1$, $R^2$, and $R^3$ are identical or different and are hydrogen atoms or monovalent hydrocarbon groups (with the provisio that the case in which $R^1$, $R^2$, and $R^3$ are all hydrogen atoms is omitted); and a diamine (3) having 8 or less carbon atoms in total and represented by Formula (a-2), where $R^4$ to $R^7$ are identical or different and are hydrogen atoms or monovalent hydrocarbon groups, and $R^8$ is a divalent hydrocarbon group; and in particular, preferably contains the monoamine (1) in combination with the monoamine (2) and/or the diamine (3).

[Chem. 8]

(a-1)

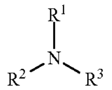

(a-2)

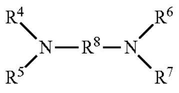

The hydrocarbon group includes an aliphatic hydrocarbon group, an alicyclic hydrocarbon group, and an aromatic hydrocarbon group, and among them, an aliphatic hydrocarbon group or an alicyclic hydrocarbon group is preferred, and in particular, an aliphatic hydrocarbon group is preferred. Thus, the monoamine (1), the monoamine (2), and the diamine (3) are preferably an aliphatic monoamine (1), an aliphatic monoamine (2), and an aliphatic diamine (3).

In addition, the monovalent aliphatic hydrocarbon group includes an alkyl group and an alkenyl group. The monovalent alicyclic hydrocarbon group includes a cycloalkyl group and a cycloalkenyl group. Furthermore, the divalent aliphatic hydrocarbon group includes an alkylene group and an alkenylene group, and the divalent alicyclic hydrocarbon group includes a cycloalkylene group and a cycloalkenylene group.

Examples of the monovalent hydrocarbon group in $R^1$, $R^2$, and $R^3$ may include alkyl groups having approximately from 1 to 18 carbon atoms, such as a methyl group, an ethyl group, a propyl group, an isopropyl group, a butyl group, an isobutyl group, an sec-butyl group, a tert-butyl group, a pentyl group, a hexyl group, a decyl group, a dodecyl group, a tetradecyl group, an octadecyl group; alkenyl groups having approximately from 2 to 18 carbon atoms, such as a vinyl group, an allyl group, a methallyl group, a 1-propenyl group, an isopropenyl group, a 1-butenyl group, a 2-butenyl group, a 3-butenyl group, a 1-pentenyl group, a 2-pentenyl group, a 3-pentenyl group, a 4-pentenyl group, and a 5-hexenyl group; cycloalkyl groups having approximately from 3 to 18 carbon atoms, such as a cyclopropyl group, a cyclobutyl group, a cyclopentyl group, a cyclohexyl group, and a cyclooctyl group; and cycloalkenyl groups having approximately from 3 to 18 carbon atoms, such as a cyclopentenyl group and a cyclohexenyl group.

Examples of the monovalent hydrocarbon groups in $R^4$ to $R^7$ may include, among those exemplified above, alkyl groups having approximately from 1 to 7 carbon atoms, alkenyl groups having approximately from 2 to 7 carbon atoms, cycloalkyl groups having approximately from 3 to 7 carbon atoms, and cycloalkenyl groups having approximately from 3 to 7 carbon atoms.

Examples of the divalent hydrocarbon group in $R^8$ may include alkylene groups having from 1 to 8 carbon atoms, such as a methylene group, a methylmethylene group, a dimethylmethylene group, an ethylene group, a propylene group, a trimethylene group, a tetramethylene group, a pentamethylene group, and a heptamethylene group; and alkenylene groups having from 2 to 8 carbon atoms, such as a vinylene group, a propenylene group, a 1-butenylene group, a 2-butenylene group, a butadienylene group, a pentenylene group, a hexenylene group, a heptenylene group, and an octenylene group.

The hydrocarbon groups in the above $R^1$ to $R^8$ may have a substituent of various types [e.g., such as a halogen atom, an oxo group, a hydroxyl group, a substituted oxy group (e.g., such as a $C_{1-4}$ alkoxy group, a $C_{6-10}$ aryloxy group, a $C_{7-16}$ aralkyloxy group, or a $C_{1-4}$ acyloxy group), a carboxyl group, a substituted oxycarbonyl group (e.g., such as a $C_{1-4}$ alkoxycarbonyl group, a $C_{6-10}$ aryloxycarbonyl group, or a $C_{7-16}$ aralkyloxycarbonyl group), a cyano group, a nitro group, a sulfo group, or a heterocyclic group]. In addition, the hydroxyl group and the carboxyl group may be protected with a protecting group commonly used in the field of organic synthesis.

The monoamine (1) is a compound that is adsorbed on the surfaces of the metal nanoparticles and prevents agglomeration of the metal nanoparticles and enlargement of the agglomeration, that is, a compound having a function of imparting high dispersibility to the metal nanoparticles. Examples of the monoamine (1) include primary monoamines having a linear alkyl group, such as n-hexylamine, n-heptylamine, n-octylamine, n-nonylamine, n-decylamine, n-undecylamine, and n-dodecylamine; primary amines having a branched alkyl group, such as isohexylamine, 2-ethylhexylamine, and tert-octylamine; a primary amine having a cycloalkyl group, such as cyclohexylamine; a primary amine having an alkenyl group, such as oleylamine; secondary amines having a linear alkyl group, such as N,N-dipropylamine, N,N-dibutylamine, N,N-dipentylamine, N,N-dihexylamine, N,N-dipeptylamine, N,N-dioctylamine, N,N-dinonylamine, N,N-didecylamine, N,N-diundecylamine, N,N-didodecylamine, and N-propyl-N-butylamine; secondary amines having a branched alkyl group, such as N,N-diisohexylamine and N,N-di(2-ethylhexyl)amine; tertiary amines having a linear alkyl group, such as tributylamine and trihexylamine; and tertiary amines having a branched alkyl group, such as triisohexylamine and tri(2-ethylhexyl)amine.

Among the above monoamines (1), an amine (in particular, a primary amine) having a linear alkyl group having from 6 to 18 carbon atoms in total (more preferably up to 16 and particularly preferably up to 12 carbon atoms in total) is preferred in that such an amine can provide space between the metal nanoparticles when the amino groups is adsorbed on the metal nanoparticle surfaces, thus providing the effect of preventing agglomeration of the metal nanoparticles, and such an amine can be easily removed during sintering. In particular, n-hexylamine, n-heptylamine, n-octylamine, n-nonylamine, n-decylamine, n-undecylamine, n-dodedeyclamine, and the like are preferred.

The monoamine (2) has a shorter hydrocarbon chain than that of the monoamine (1), and thus the function of the monoamine (2) itself to impart high dispersibility to the metal nanoparticles is low. However, the monoamine (2) has a high coordination ability to a metal atom due to its higher polarity than that of the monoamine (1), and thus has an effect of promoting complex formation. In addition, the monoamine (2) has a short hydrocarbon chain and thus can be removed from the metal nanoparticle surfaces in a short time (e.g., not longer than 30 minutes and preferably not longer than 20 minutes) even in low-temperature sintering, thus providing a sintered body with excellent electrical conductivity.

Examples of the monoamine (2) include a primary amine having a linear or branched alkyl group and having from 2 to 5 carbon atoms in total (preferably from 4 to 5 carbon atoms in total), such as n-butylamine, isobutylamine, sec-butylamine, tert-butylamine, pentylamine, isopentylamine, and tert-pentylamine; and a secondary amine having a linear or branched alkyl group and having from 2 to 5 carbon atoms in total (preferably from 4 to 5 carbon atoms in total), such as N,N-diethylamine. In an embodiment of the present invention, among these, a primary amine having a linear alkyl group and having from 2 to 5 carbon atoms in total (preferably from 4 to 5 carbon atoms in total) is preferred.

The diamine (3) has 8 or less carbon atoms in total and has a high coordination ability to a metal atom due to its higher polarity than that of the monoamine (1), and thus has an effect of promoting complex formation. In addition, the diamine (3) has an effect of promoting thermal decomposition of the complex at lower temperature and in a short time in the thermal decomposition of the complex, and the use of the diamine (3) can perform the production of the surface-modified metal nanoparticles more efficiently. Furthermore, the surface-modified metal nanoparticles having a configuration of being coated with the protective agent containing the diamine (3) exhibit excellent dispersion stability in a highly polar dispersion medium. Moreover, the diamine (3) has a short hydrocarbon chain and thus can be removed from the metal nanoparticle surfaces in a short time (e.g., not longer than 30 minutes and preferably not longer than 20 minutes) even by low-temperature sintering, thus providing a sintered body with excellent electrical conductivity.

Examples of the diamine (3) may include diamines in which $R^4$ to $R^7$ in Formula (a-2) are hydrogen atoms, and $R^8$ is a linear or branched alkylene group, such as 2,2-dimethyl-1,3-propanediamine, 1,4-butanediamine, 1,5-pentanediamine, 1,6-hexanediamine, 1,7-heptanediamine, 1,8-octanediamine, and 1,5-diamino-2-methylpentane; diamines in which $R^4$ and $R^6$ in Formula (a-2) are identical or different and linear or branched alkyl groups, $R^5$ and $R^7$ are hydrogen atoms, and $R^8$ is a linear or branched alkylene group, such as N,N'-dimethylethylenediamine, N,N'-diethylethylenediamine, N,N'-dimethyl-1,3-propanediamine, N,N'-diethyl-1,3-propanediamine, N,N'-dimethyl-1,4-butanediamine, N,N'-diethyl-1,4-butanediamine, and N,N'-dimethyl-1,6-hexanediamine; and diamines in which $R^4$ and $R^5$ in Formula (a-2) are identical or different and linear or branched alkyl groups, $R^6$ and $R^7$ are hydrogen atoms, and $R^8$ is a linear or branched alkylene group, such as N,N-dimethylethylenediamine, N,N-diethylethylenediamine, N,N-dimethyl-1,3-propanediamine, N,N-diethyl-1,3-propanediamine, N,N-dimethyl-1,4-butanediamine, N,N-diethyl-1,4-butanediamine, and N,N-dimethyl-1,6-hexanediamine.

Among them, diamines in which $R^4$ and $R^5$ in Formula (a-2) above are identical or different and linear or branched alkyl groups, $R^6$ and $R^7$ are hydrogen atoms, and $R^8$ is a linear or branched alkylene group [in particular, diamines in which $R^4$ and $R^5$ in Formula (a-2) are linear alkyl groups, $R^6$ and $R^7$ are hydrogen atoms, and $R^8$ is a linear alkylene group] are preferred.

In diamines in which $R^4$ and $R^5$ in Formula (a-2) are identical or different and are linear or branched alkyl groups, and $R^6$ and $R^7$ are hydrogen atoms, that is, diamines having a primary amino group and a tertiary amino group, the primary amino group has a high coordination ability to a metal atom, but the tertiary amino group has a poor coordination ability to a metal atom, and thus this prevents a resulting complex from becoming excessively complicated, thereby allowing the complex to be thermally decomposed at lower temperature and in a shorter time in the thermal decomposition of the complex. Among them, diamines having 6 or less (e.g., from 1 to 6, preferably from 4 to 6) carbon atoms in total are preferred, and diamines having 5 or less (e.g., from 1 to 5, preferably from 4 to 5) carbon atoms in total are more preferred in that they can be removed from the metal nanoparticle surfaces in a short time in low-temperature sintering.

The proportion of the content of the monoamine (1) in the total amount of the organic protective agent contained in the electrically conductive ink according to an embodiment of the present invention, and the proportion of the total content of the monoamine (2) and the diamine (3) therein are preferably within the ranges described below.

Content of monoamine (1): for example, from 5 to 65 mol % (the lower limit is preferably 10 mol %, particularly preferably 20 mol %, and most preferably 30 mol %. In addition, the upper limit is preferably 60 mol %, and particularly preferably 50 mol %)

Total content of monoamine (2) and diamine (3): for example, from 35 to 95 mol % (the lower limit is preferably 40 mol %, and particularly preferably 50 mol %. In addition, the upper limit is preferably 90 mol %, particularly preferably 80 mol %, and most preferably 70 mol %)

The proportion of the content of the monoamine (2) in the total amount of the organic protective agent contained in the electrically conductive ink according to an embodiment of the present invention, and the proportion of the content of the diamine (3) therein are preferably within the ranges described below.

Content of monoamine (2): for example, from 5 to 65 mol % (the lower limit is preferably 10 mol %, particularly preferably 20 mol %, and most preferably 30 mol %. In addition, the upper limit is preferably 60 mol %, and particularly preferably 50 mol %)

Content of diamine (3): for example, from 5 to 50 mol % (the lower limit is preferably 10 mol %. In addition, the upper limit is preferably 40 mol %, and particularly preferably 30 mol %)

The monoamine (1) contained in the above range provides dispersion stability of the metal nanoparticles. With the content of the monoamine (1) below the above range, the metal nanoparticles would tend to be prone to agglomeration. On the other hand, the content of the monoamine (1) exceeding the above range would cause difficulty in removing the organic protective agent from the metal nanoparticle surfaces in a short time when the sintering temperature is low, tending to reduce the electrical conductivity of the resulting sintered body.

The monoamine (2) contained in the above range provides the effect of promoting complex formation. In addition, this allows the organic protective agent to be removed from the metal nanoparticle surfaces in a short time even when the sintering temperature is low, providing a sintered body with excellent electrical conductivity.

The diamine (3) contained in the above range easily provides the effect of promoting complex formation and the effect of promoting the thermal decomposition of the complex. In addition, the surface-modified metal nanoparticles having a configuration of being coated with the protective agent containing the diamine (3) exhibit excellent dispersion stability in a highly polar dispersion medium.

In an embodiment of the present invention, the use of the monoamine (2) and/or the diamine (3) having a high coordination ability to metal atoms of the metal compound is preferred, in that the use can reduce the amount of the monoamine (1) used depending on the proportion of the monoamine (2) and/or the diamine (3) used and can remove the organic protective agent from the metal nanoparticle surfaces in a short time even when the sintering temperature is low, providing a sintered body with excellent electrical conductivity.

The amine used as the organic protective agent in an embodiment of the present invention may contain an additional amine other than the monoamine (1), the monoamine (2), and the diamine (3), but the proportion of the total content of the monoamine (1) and the monoamine (2), and the diamine (3) accounting for the total amines contained in the protective agent is, for example, preferably from 60 wt. % or greater, particularly preferably 80 wt. % or greater, and most preferably 90 wt. % or greater. Note that the upper limit is 100 wt. %. That is, the content of the additional amine is preferably not greater than 40 wt. %, particularly preferably not greater than 20 wt. %, and most preferably not greater than 10 wt. %.

The amount of the organic protective agent [in particular, monoamine (1)+monoamine (2)+diamine (3)] used is not particularly limited but is preferably approximately from 1 to 50 mol, particularly preferably from 2 to 50 mol, and most preferably from 6 to 50 mol, relative to 1 mol of metal atoms in the metal compound of the raw material. When the amount of the organic protective agent is below the above range, the metal compound not converted to a complex would be prone to remain in the formation of the complex, tending to be difficult to impart sufficient dispersibility to the metal nanoparticles.

To further improve the dispersibility of the metal nanoparticles, one or more types of compounds having a carboxyl group (for example, compounds having from 4 to 18 carbon atoms and having a carboxyl group, preferably aliphatic monocarboxylic acids having from 4 to 18 carbon atoms) may be contained together with the compound having an amino group as the organic protective agent.

Examples of the aliphatic monocarboxylic acid may include saturated aliphatic monocarboxylic acids having 4 or more carbon atoms, such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, and icosanoic acid; and unsaturated aliphatic monocarboxylic acids having 8 or more carbon atoms, such as oleic acid, elaidic acid, linoleic acid, palmitoleic acid, and eicosenoic acid.

Among them, saturated or unsaturated aliphatic monocarboxylic acids having from 8 to 18 carbon atoms (in particular, octanoic acid and oleic acid) are preferred. When the carboxyl groups of the aliphatic monocarboxylic acid are adsorbed on the metal nanoparticle surfaces, the saturated or unsaturated aliphatic hydrocarbon chain having from 8 to 18 carbon atoms causes a steric hindrance and thus can provide space between the metal nanoparticles, thus improving the effect of preventing agglomeration of the metal nanoparticles.

The amount of the compound having a carboxyl group used is, for example, approximately from 0.05 to 10 mol, preferably from 0.1 to 5 mol, and particularly preferably from 0.5 to 2 mol, relative to 1 mol of metal atoms in the metal compound. The amount of the compound having a carboxyl group used below the above range would cause difficulty in providing an effect of improving dispersion stability. On the other hand, the compound having a carboxyl group, even when used in an excessive amount, would saturate the effect of improving the dispersion stability while it tends to be difficult to remove the compound by low-temperature sintering.

The reaction between the organic protective agent and the metal compound is performed in the presence or absence of the dispersion medium. As the dispersion medium, for example, an alcohol having 3 or more carbon atoms can be used.

Examples of the alcohol having 3 or more carbon atoms include n-propanol (boiling point: 97° C.), isopropanol (boiling point: 82° C.), n-butanol (boiling point: 117° C.), isobutanol (boiling point: 107.89° C.), sec-butanol (boiling point: 99.5° C.), tert-butanol (boiling point: 82.45° C.), n-pentanol (boiling point: 136° C.), n-hexanol (boiling point: 156° C.), n-octanol (boiling point: 194° C.), and 2-octanol (boiling point: 174° C.). Among them, alcohols having from 4 to 6 carbon atoms are preferred, and in particular, n-butanol and n-hexanol are preferred in that higher temperature can be set for the thermal decomposition of the complex to be performed later and in terms of the convenience of the post-treatment of the resulting surface-modified metal nanoparticles.

In addition, the amount of the dispersion medium used is, for example, not less than 120 parts by weight, preferably not less than 130 parts by weight, and more preferably not less than 150 parts by weight, relative to 100 parts by weight of the metal compound. The upper limit of the amount of the dispersion medium used is, for example, 1000 parts by weight, preferably 800 parts by weight, and particularly preferably 500 parts by weight.

The reaction between the organic protective agent and the metal compound is preferably performed at ordinary temperature (from 5 to 40° C.). The reaction is accompanied by heat generation due to the coordination reaction of the organic protective agent to the metal compound and thus may be performed while the reaction mixture is appropriately cooled to the above temperature range.

The reaction time between the organic protective agent and the metal compound is, for example, approximately from 30 minutes to 3 hours. This results in a metal-organic protective agent complex (metal-amine complex when an amine is used as the organic protective agent).

Thermal Decomposition

The thermal decomposition is a step of thermally decomposing the resulting metal-organic protective agent complex through the formation of the complex to form the surface-modified metal nanoparticles. It is believed that the metal-organic protective agent complex is heated to cause thermal decomposition of the metal compound to form metal atoms while maintaining coordination bonding of the organic protective agent to the metal atoms, and then agglomeration of the metal atoms to which the organic protective agent is coordinated, leading to formation of metal nanoparticles that are coated with an organic protective film.

The thermal decomposition is preferably performed in the presence of a dispersion medium, and the alcohol described above can be suitably used as the dispersion medium. In addition, the thermal decomposition temperature is to be a temperature at which the surface-modified metal nanoparticles are formed, and when the metal-organic protective agent complex is a silver oxalate-organic protective agent complex, the temperature is, for example, approximately from 80 to 120° C., preferably from 95 to 115° C., and particularly preferably from 100 to 110° C. In terms of preventing the elimination of the surface modification portion of the surface-modified metal nanoparticle, the thermal decomposition is preferably performed at a temperature as low as possible within the above temperature range. The thermal decomposition duration is, for example, approximately from 10 minutes to 5 hours.

In addition, the thermal decomposition of the metal-organic protective agent complex is preferably performed in an air atmosphere or in an inert gas atmosphere, such as argon.

(Washing Step)

The excess organic protective agent, if present after the completion of the thermal decomposition reaction of the metal-organic protective agent complex, is preferably removed by decantation, which may be repeated once or more times as necessary. In addition, the surface-modified metal nanoparticles after the completion of the decantation is preferably subjected to the preparation of the electrically conductive ink described below in a wet state without drying or solidifying in that this can prevent re-agglomeration of the surface-modified metal nanoparticles and maintain high dispersibility.

Decantation is performed, for example, by washing the surface-modified metal nanoparticles in a suspended state with a cleaning agent, precipitating the surface-modified metal nanoparticles by centrifugation, and removing the supernatant. The cleaning agent used is preferably one or more types of linear or branched alcohols having from 1 to 4 (preferably from 1 to 2) carbon atoms, such as methanol, ethanol, n-propanol, or isopropanol in terms of achieving good precipitation of the surface-modified metal nanoparticles and efficiently separating and removing the cleaning agent by centrifugation after the washing.

In an embodiment of the present invention, the ink used in the inkjet printing (hereinafter, also referred to as "ink for inkjet printing") can be prepared by mixing the surface-modified metal nanoparticles obtained through the above steps (preferably, surface-modified metal nanoparticles in a wet state), a dispersion medium, and, if necessary, an additive. For the mixing, a commonly known mixing apparatus, such as, for example, a self-rotating stirring defoaming apparatus, a homogenizer, a planetary mixer, a three-roll mill, or a bead mill, can be used. In addition, each component may be mixed at the same time or sequentially. The mixing portion of each component can be appropriately adjusted in the range described below.

The content of the surface-modified metal nanoparticles (in terms of metal elements) in the total amount of the ink for inkjet printing (100 wt. %) is, for example, approximately from 35 to 70 wt. %. The lower limit is preferably 40 wt. %, particularly preferably 45 wt. %, most preferably 50 wt. %, and particularly preferably 55 wt. % from the perspective of obtaining a coating film or sintered body with a higher film thickness. The upper limit is preferably 65 wt. %, and particularly preferably 60 wt. % from the perspective of coatability (stability of ejection from the head nozzle when applied by inkjet printing).

As the dispersion medium contained in the ink for inkjet printing described above, a common organic solvent can be used without particular limitation, and examples thereof include aliphatic hydrocarbon solvents such as pentane, hexane, heptane, octane, nonane, decane, undecane, dodecane, tridecane, and tetradecane; aromatic hydrocarbon solvents such as toluene, xylene, and mesitylene; and alcohol solvents such as methanol, ethanol, propanol, n-butanol, n-pentanol, n-hexanol, n-heptanol, n-octanol, n-nonanol, n-decanol, and terpineol. Depending on the desired concentration and viscosity, the type and amount of organic solvent can be appropriately selected. One type of organic solvent used in the dispersion medium can be used alone, or two or more of thereof can be used in combination.

The content of the dispersion medium (in terms of metal elements) in the ink for inkjet printing is from 20 to 100 parts by weight, preferably from 30 to 90 parts by weight, more preferably from 40 to 80 parts by weight, even more preferably from 50 to 75 parts by weight, particularly preferably from 55 to 75 parts by weight, and most preferably from 60 to 75 parts by weight per 100 parts by weight of the surface-modified metal nanoparticles.

The content of the dispersion medium in the total amount of the ink for inkjet printing (100 wt. %) is, for example, from 20 to 65 wt. %, preferably from 25 to 60 wt. %, more preferably from 30 to 55 wt. %, and most preferably from 30 to 50 wt. %. The ink for inkjet printing contains the dispersion medium in an amount within the range described above and thus has excellent coatability. So, the ink for inkjet printing, when applied by inkjet printing, can well maintain stability of ejection from the nozzle of the head.

The viscosity (at 25° C. and shear rate 10 (l/s)) of the ink for inkjet printing is from 1 to 100 mPa·s, for example. The upper limit of the viscosity is preferably 50 mPa·s, particularly preferably 20 mPa·s, and most preferably 15 mPa·s. The lower limit of the viscosity is preferably 2 mPa·s, particularly preferably 3 mPa·s, and most preferably 5 mPa·s.

The obtained ink for inkjet printing described above can be used also in a printing process other than inkjet printing, for example, gravure printing, flexographic printing, and the like.

The screen printing in an embodiment of the present invention is a method that includes transferring a wiring pattern to the optical member by squeezing the ink containing the electrically conductive substance (extruding the ink with a squeegee) to allow the ink to pass through a screen having an opening corresponding to the wiring pattern.

The ink containing the electrically conductive substance used in the screen printing according to an embodiment of the present invention (hereinafter, also referred to as "ink for screen printing") is not particularly limited as long as it can be used for screen printing. From the perspective of easily forming a wire of a desired width at a target position of the optical member, an ink containing surface-modified metal nanoparticles is preferred, and a silver ink is particularly preferred.

The "surface-modified metal nanoparticles" contained in the ink for screen printing described above can be the same as the "surface-modified metal nanoparticles" used in the ink for inkjet printing described above, and can be available from a similar method.

The ink for screen printing described above can be prepared by mixing the surface-modified metal nanoparticles described above (preferably, surface-modified metal nanoparticles in a wet state), a solvent, and, if necessary, an additive. For the mixing, a commonly known mixing apparatus, such as, for example, a self-rotating stirring defoaming apparatus, a homogenizer, a planetary mixer, a three-roll mill, or a bead mill, can be used. In addition, each component may be mixed at the same time or sequentially. The mixing portion of each component can be appropriately adjusted in the range described below.

The content of the surface-modified metal nanoparticles in the total amount of the ink for screen printing (100 wt. %) is, for example, from 60 to 85 wt. %, and the lower limit is preferably 70 wt. % in that the effect of improving steady contact to the optical member is obtained. The upper limit of the content is preferably 80 wt. % and particularly preferably 75 wt. %.

As the solvent contained in the ink for screen printing described above, a common organic solvent can be used without particular limitation, and examples thereof include aliphatic hydrocarbon solvents such as pentane, hexane, heptane, octane, nonane, decane, undecane, dodecane, tridecane, and tetradecane; aromatic hydrocarbon solvents such as toluene, xylene, and mesitylene; and alcohol solvents such as methanol, ethanol, propanol, n-butanol, n-pentanol, n-hexanol, n-heptanol, n-octanol, n-nonanol, n-decanol, and terpineol. Since clogging of a screen plate caused by volatilization of the solvent is suppressed, and continuous printing is thus possible, at least a terpene solvent is preferably contained in the ink for screen printing.

The terpene solvent preferably has a boiling point of 130° C. of higher (for example, from 130 to 300° C., and preferably from 200 to 300° C.).

Furthermore, a viscosity (at 20° C.) of the terpene solvent is, for example, from 50 to 250 mPa·s (particularly preferably from 100 to 250 mPa·s, most preferably from 150 to 250 mPa·s), and the use of the viscosity is preferred in that the viscosity of the obtained ink for screen printing can be appropriately increased, and thin lines can be drawn with excellent precision. Note that the viscosity of the solvent is a value at 20° C. and a shear rate of 20 (l/s) measured using a rheometer (trade name "Physica MCR301", available from Anton Paar).

Examples of the terpene solvent include 4-(1'-acetoxy-1'-methylester)-cyclohexanol acetate, 1,2,5,6-tetrahydrobenzyl alcohol, 1,2,5,6-tetrahydrobenzyl acetate, cyclohexyl acetate, 2-methylcyclohexyl acetate; 4-t-butylcyclohexyl acetate, terpineol, dihydroterpineol, dihydroterpinyl acetate, α-terpineol, β-terpineol, γ-terpineol, L-α-terpineol, dihydroterpinyloxyethanol, tarpinyl methyl ether, and dihydroterpinyl methyl ether. One of these solvents can be used alone or two or more in combination. In the present invention, for example, the trade names "Terusolve MTPH", "Terusolve IPG", "Terusolve IPG-Ac", "Terusolve IPG-2Ac", "Terpineol C" (mixtures of α-terpineol, β-terpineol, and γ-terpineol, boiling point: 218° C.; viscosity: 54 mPa·s), "Terusolve DTO-210", "Terusolve THA-90", "Terusolve THA-70" (boiling point: 223° C., viscosity: 198 mPa·s), "Terusolve TOE-100" (all available from Nippon Terpene Chemicals, Inc.), and the like can be used.

The solvent used in the ink for screen printing described above may contain one or more types of other solvents in addition to the terpene solvent. Examples of other solvents include glycol ether solvents having a boiling point of 130° C. or higher.

Examples of the glycol ether solvent may include compounds represented by Formula (b) below:

$$R^{11}\text{—}(O\text{—}R^{13})_m\text{—}OR^{12} \qquad (b)$$

wherein $R^{11}$ and $R^{12}$ are identical or different and represent alkyl or acyl groups, $R^{13}$ represents an alkylene group having from 1 to 6 carbon atoms, and m represents an integer of 1 or greater.

Examples of the alkyl groups in $R^{11}$ and $R^{12}$ described above may include linear or branched alkyl groups having from 1 to 10 carbon atoms (preferably, from 1 to 5).

Examples of the acyl groups (RCO-groups) in $R^{11}$ and $R^{12}$ described above may include acyl groups (for example, acetyl groups, propionyl groups, butyryl groups, isobutyryl groups, and pivaloyl groups) in which R described above is a linear or branched alkyl group having from 1 to 10 carbon atoms (preferably, from 1 to 5).

Among these, a compound in which $R^{11}$ and $R^{12}$ in Formula (b) are groups different from each other (different alkyl groups, different acyl groups, or an alkyl group and an acyl group) is preferred, and a compound in which $R^{11}$ and $R^{12}$ in Formula (b) are alkyl groups different from each other is particularly preferred. A compound including a linear or branched alkyl group having from 4 to 10 carbon atoms (preferably from 4 to 6) and a linear or branched alkyl group having from 1 to 3 carbon atoms is most preferred.

Examples of such an alkylene group in $R^{13}$ described above include a methylene group, a methylmethylene group, a dimethylmethylene group, an ethylene group, a propylene group, a trimethylene group, a tetramethylene group, a pentamethylene group, and a hexamethylene group. In an embodiment of the present invention, among these, an alkylene group having from 1 to 4 carbon atoms is preferred, and an alkylene group having from 1 to 3 carbon atoms is particularly preferred. An alkylene group having from 2 to 3 carbon atoms is most preferred.

m is an integer of 1 or greater and, for example, an integer of from 1 to 8, preferably an integer of from 1 to 3, and particularly preferably an integer of from 2 to 3.

The boiling point of the compound represented by Formula (b) is, for example, 130° C. or higher (for example, from 130 to 300° C.), preferably 170° C. or higher, and particularly preferably 200° C. or higher.

Examples of the compound represented by Formula (b) include glycol diether, glycol ether acetate, and glycol diacetate such as ethylene glycol methyl ether acetate (boiling point: 145° C.), ethylene glycol-n-butyl ether acetate (boiling point: 188° C.), propylene glycol methyl-n-propyl ether (boiling point: 131° C.); propylene glycol methyl-n-butyl ether (boiling point: 155° C.), propylene glycol methyl isoamyl ether (boiling point: 176° C.), propylene glycol diacetate (boiling point: 190° C.), propylene glycol methyl ether acetate (boiling point: 146° C.), 3-methoxybutyl acetate (boiling point: 171° C.), 1,3-butylene glycol diacetate (boiling point: 232° C.), 1,4-butanediol diacetate (boiling point: 232° C.), 1,6-hexanediol diacetate (boiling point: 260° C.), diethylene glycol dimethyl ether (boiling point: 162° C.), diethylene glycol diethyl ether (boiling point: 189° C.), diethylene glycol dibutyl ether (boiling point: 256° C.), diethylene glycol ethyl methyl ether (boiling point: 176° C.), diethylene glycol isopropyl methyl ether (boiling point: 179° C.), diethylene glycol methyl-n-butyl ether (boiling point: 212° C.), diethylene glycol-n-butyl ether acetate (boiling point: 247° C.), diethylene glycol ethyl ether acetate (boiling point: 218° C.), diethylene glycol butyl ether acetate (boiling point: 246.8° C.), dipropylene glycol methyl-isopentyl ether (boiling point: 227° C.), dipropylene glycol dimethyl ether (boiling point: 175° C.), dipropylene glycol methyl-n-propyl ether (boiling point: 203° C.), dipropylene glycol methyl-n-butyl ether (boiling point: 216° C.), dipropylene glycol methyl cyclopentyl ether (boiling point: 286° C.), dipropylene glycol methyl ether acetate (boiling point: 195° C.), triethylene glycol dimethyl ether (boiling point: 216° C.), triethylene glycol methyl-n-butyl ether (boiling point: 261° C.), tripropylene glycol methyl-n-propyl ether (boiling point: 258° C.), tripropylene glycol dimethyl ether (boiling point: 215° C.), and tetraethylene glycol dimethyl ether (boiling point: 275° C.). One of these solvents can be used alone or two or more in combination.

Examples of the glycol ether solvent may include compounds (glycol monoethers) represented by Formula (b') below:

$$R^{14}—(O—R^{15})_n—OH \quad (b')$$

wherein $R^{14}$ represents an alkyl group or an aryl group, $R^{15}$ represents an alkylene group having from 1 to 6 carbon atoms, and n represents an integer of 1 or greater.

Examples of the alkyl group in $R^{14}$ described above may include linear or branched alkyl groups having from 1 to 10 carbon atoms (preferably, from 1 to 5). Examples of the aryl group may include aryl groups having from 6 to 10 carbon atoms (for example, phenyl groups).

Examples of the alkylene group in $R^{15}$ described above include linear or branched alkylene groups such as a methylene group, a methylmethylene group, a dimethylmethylene group, an ethylene group, a propylene group, a trimethylene group, a tetramethylene group, a pentamethylene group, and a hexamethylene group. Among these, an alkylene group having from 1 to 4 carbon atoms is preferred, and an alkylene group having from 1 to 3 carbon atoms is particularly preferred. An alkylene group having from 2 to 3 carbon atoms is most preferred.

n is an integer of 1 or greater and, for example, an integer of from 1 to 8, preferably an integer of from 1 to 3, and particularly preferably an integer of from 2 to 3.

The boiling point of the compound represented by Formula (b') is, for example, 130° C. or higher (for example, from 130 to 310° C.), preferably from 130 to 250° C., particularly preferably from 130 to 200° C., most preferably from 130 to 180° C., and especially preferably from 140 to 180° C.

Examples of the compound represented by Formula (b') include ethylene glycol monomethyl ether (boiling point: 124° C.), ethylene glycol monoisopropyl ether (boiling point: 141.8° C.), ethylene glycol monobutyl ether (boiling point: 171.2° C.), ethylene glycol monoisobutyl ether (boiling point: 160.5° C.), ethylene glycol monotert-butyl ether (boiling point: 152° C.), ethylene glycol monohexyl ether (boiling point: 208° C.), ethylene glycol mono-2-ethyl hexyl ether (boiling point: 229° C.), ethylene glycol monophenyl ether (boiling point: 244.7° C.), ethylene glycol monobenzyl ether (boiling point: 256° C.), diethylene glycol monomethyl ether (boiling point: 194° C.), diethylene glycol monobutyl ether (=butyl carbitol, boiling point: 230° C.), diethylene glycol monoisobutyl ether (boiling point: 220° C.), diethylene glycol monoisopropyl ether (boiling point: 207° C.), diethylene glycol monopentyl ether (boiling point: 162° C.), diethylene glycol monoisopentyl ether, diethylene glycol monohexyl ether (=hexyl carbitol, boiling point: 259.1° C.), diethylene glycol mono-2-ethyl hexyl ether (boiling point: 272° C.), diethylene glycol monophenyl ether (boiling point: 283° C.), diethylene glycol monobenzyl ether (boiling point: 302° C.), triethylene glycol monomethyl ether (boiling point: 249° C.), triethylene glycol monobutyl ether (boiling point: 271.2° C.), propylene glycol monoethyl ether (boiling point: 132.8° C.), propylene glycol monopropyl ether (boiling point: 149° C.), propylene glycol monobutyl ether (boiling point: 170° C.), dipropylene glycol monomethyl ether (boiling point: 188° C.), and 3-methoxy-1-butanol (boiling point: 158° C.). One of these solvents can be used alone or two or more in combination.

The content of the terpene solvent in the total amount of the ink for screen printing (100 wt. %) is, for example, from 5 to 30 wt. %, and the lower limit is preferably 10 wt. %, and particularly preferably 14 wt. %. The upper limit of the content is preferably 25 wt. % and particularly preferably 18 wt. %. The terpene solvent contained in the range described above can provide the effect of suppressing bleeding and improving the drawing accuracy of thin lines and the effect of improving the continuous printing properties.

The content of the compound represented by Formula (b) in the total amount of the ink for screen printing (100 wt. %) is, for example, from 0.5 to 5 wt. %, and the lower limit is preferably 1.6 wt. %. The upper limit of the content is preferably 3 wt. % and particularly preferably 2 wt. %. The blending of the compound represented by Formula (b) in an amount within the above range can impart thixotropy, make the edge of a drawing par sharper, and improve the printing accuracy. In addition, the effect of improving continuous printing properties can also be obtained.

Additionally, the ink for screen printing can contain the compound represented by Formula (b') in an amount of 10 wt. % or less (from 5 to 10 wt. %), and preferably 8.5 wt. % or less of the total amount of the ink.

The ink for screen printing described above may contain, as a solvent having a boiling point of 130° C. or higher, one or more types of ethyl lactate acetate (boiling point: 181° C.), tetrahydrofurfuryl acetate (boiling point: 195° C.), tetrahydrofurfuryl alcohol (boiling point: 176° C.), ethylene glycol (boiling point: 197° C.), and the like, in addition to the compound represented by Formula (b) above and the compound represented by Formula (b') above. However, the content of such other solvents having a boiling point of 130° C. or higher is 30 wt. % or less, preferably 20 wt. % or less, particularly preferably 15 wt. % or less, most preferably 10 wt. % or less, even more preferably 5 wt. % or less, and especially preferably 1 wt. % or less of the total amount of the solvent contained in the ink for screen printing.

Furthermore, the ink for screen printing may also contain a solvent having a boiling point of lower than 130° C. [for example, ethylene glycol dimethyl ether (boiling point: 85° C.), propylene glycol monomethyl ether (boiling point: 120° C.), and propylene glycol monomethyl ether (boiling point: 97° C.)]. The content of the solvent having a boiling point of lower than 130° C. (total amount, if two or more types are contained) in the total amount of the ink for screen printing (100 wt. %) is preferably 20 wt. % or less, more preferably 10 wt. % or less, particularly preferably 5 wt. % or less, and most preferably 1 wt. % or less. In the above ink for screen printing, when the content of the solvent having a boiling point of lower than 130° C. is suppressed to the range described above, clogging of the screen plate caused by volatilization of the solvent can be suppressed, and continuous printing is thus easily possible.

One type of solvent used in the above ink for screen printing can be used alone, or two or more of thereof can be used in combination.

The ink for screen printing described above can contain, in addition to the above components, an additive such as a binder resin, a surface energy modifier, a plasticizer, a leveling agent, an antifoaming agent, or a tackifier, as necessary. Among these, a binder resin is preferably contained in that the effect of improving the steady contact and flexibility of a sintered body to the optical member can be obtained, the sintered body being obtained by applying (or printing) the ink for screen printing onto the optical member and then sintering.

Examples of the binder resin include vinyl chloride-vinyl acetate copolymer resins, polyvinyl butyral resins, polyester resins, acrylic resins, and cellulosic resins. One of these solvents can be used alone or two or more in combination. Of these, a cellulosic resin is preferably used, and commercially available products such as the trade names "ETHOCEL std.200" and "ETHOCEL std.300" (both available from The Dow Chemical Company) can be used.

The content of the binder resin (for example, cellulosic resin) is, for example, approximately from 0.5 to 5.0 wt. %, and preferably from 1.0 to 3.0 wt. % of the total amount of the ink for screen printing.

The viscosity (at 25° C., shear rate 10 (l/s)) of the ink for screen printing is, for example, 60 Pa·s or greater, preferably 70 Pa·s or greater, more preferably 80 Pa·s or greater, even more preferably 90 Pa s or greater, even more preferably 100 Pa s or greater, and particularly preferably 150 Pa·s or greater. The upper limit of the viscosity is, for example, approximately 500 Pa·s, preferably 450 Pa·s, particularly preferably 400 Pa·s, and most preferably 350 Pa·s.

The viscosity (at 25° C. and shear rate 100 (l/s)) of the above ink for screen printing is, for example, from 10 to 100 Pa·s, and the upper limit thereof is preferably 80 Pa·s, particularly preferably 60 Pa·s, most preferably 50 mPa·s, and especially preferably 40 Pa·s. The lower limit of the viscosity is preferably 15 Pa·s, particularly preferably 20 Pa·s, most preferably 25 Pa·s, and especially preferably 30 Pa·s.

The ink for screen printing preferably has thixotropy, and the TI value at 25° C. (viscosity at a shear rate of 10 (l/s)/viscosity at a shear rate of 100 (l/s)) is in a range of for example from 3.0 to 10.0, preferably from 3.5 to 7.0, particularly preferably from 4.0 to 6.5, most preferably from 4.5 to 6.3, and especially preferably from 4.8 to 6.2.

As the ink for screen printing, a commercially available product, for example, a silver paste ink (product name: NP-2910D1) available from Noritake Co., Ltd. can also be used.

The method for forming the wire on the optical member according to an embodiment of the present invention includes applying the ink to the optical member by a printing process, and sintering.

In the optical member according to an embodiment of the present invention, a known or commonly used surface treatment such as roughening treatment, adhesion-facilitating treatment, antistatic treatment, sand blast treatment (sand mat treatment), corona discharge treatment, plasma treatment, excimer treatment, chemical etching treatment, water mat treatment, flame treatment, acid treatment, alkali treatment, oxidation treatment, ultraviolet irradiation treatment, or silane coupling agent treatment may be applied to the surface on which the wire is formed. The non-optical element region is preferred as the surface to be surface-treated. On the other hand, the optical element region may be surface-treated or not surface-treated.

The thickness of the coating film obtained by applying the ink is preferably in a range such that the thickness of the sintered body obtained by sintering the coating film is, for example, from 0.1 to 5 nm (preferably, 0.5 to 2 μm).

The width of the coating film obtained by applying the above ink is not particularly limited, and can be appropriately selected according to the shape, size, and the like of the optical member, and the width of the sintered body obtained by sintering the coating film is, for example, 200 nm or less (for example, from 1 to 200 μm), and preferably in a range of from 10 to 100 μm.

By sintering the coating film formed above, the coating film can be formed into an electrically conductive wire (sintered body). The sintering temperature is, for example, 150° C. or lower (the lower limit of the sintering temperature is, for example, 60° C., and is more preferably 100° C. in that the coating film can be sintered in a short period of time), particularly preferably 130° C. or lower, and most preferably 120° C. or lower. The sintering time is, for example, from 0.5 to 3 hours, preferably from 0.5 to 2 hours, and particularly preferably from 0.5 to 1 hour.

The width of the wire formed on the optical member according to an embodiment of the present invention is not particularly limited, and can be appropriately selected according to the shape, size, and the like of the optical member, and is, for example, 200 μm or less (for example, from 1 to 200 μm), and preferably in a range of from 10 to 100 μm. By setting the width of the wire to be within this range, it becomes easier to ensure conduction.

In the optical member according to an embodiment of the present invention, the wire containing the electrically conductive substance is formed, and the position thereof is not particularly limited, but when the optical member includes the optical element region and the non-optical element region described above, the wire is preferably formed in the non-optical element region for the purpose of not impairing the illumination of the laser light and the structural light that are emitted from the surface emitting laser light source and controlled by the optical element.

When the optical member according to an embodiment of the present invention has a substrate shape, the wire containing the electrically conductive substance may be formed on only one side, or may be formed on both sides.

When the ink containing the electrically conductive substance is applied to the optical member by the printing process to form the wire, the optical member is preferably an optical element array in which two or more optical elements are arranged two-dimensionally. Specifically, it is preferable that two or more optical element regions be arranged two-dimensionally, and preferably connected via a non-optical element region. By employing the optical element array, the wire containing the electrically conductive substance can be formed collectively with respect to each of the optical elements, and therefore production efficiency is greatly improved.

The optical element array can be easily available from using a mold having a molding surface in which an inverted shape corresponding to two or more optical elements arranged two-dimensionally on the optical element array is arranged two-dimensionally as the mold for manufacturing the optical member described above.

After the wire is applied to each of the optical elements arranged on the optical element array, the optical member according to an embodiment of the present invention can be obtained by singulating each optical element. Specifically, by cutting the non-optical element region connecting the two or more optical element regions, the optical member according to an embodiment of the present invention including the singulated optical element regions can be obtained.

The process of singulating the optical element array into individual optical elements is not particularly limited, and well-known and commonly used means can be employed. Among others, a blade rotating at high speed is preferably used.

In cutting using a blade rotating at high speed, the rotation speed of the blade is, for example, approximately from 10000 to 50000 rpm. Furthermore, cutting the array of optical elements using a blade rotating at high speed may generate frictional heat. Thus, it is preferred to cut the array of optical elements while cooling, in terms of being able to suppress deformation of the optical elements and reduction in optical properties due to the frictional heat. Optical elements obtained by cutting the optical element array at the non-optical element region includes an optical element region and a non-optical element region on the periphery thereof.

FIG. 1, diagrams (a), (b), and (c) are schematic diagrams illustrating an example of a preferred embodiment of the optical member of the present invention. FIG. 1, diagram (a) is a perspective view, FIG. 1, diagram (b) is a top view, and FIG. 1, diagram (c) is a side view. The optical member 10 in FIG. 1 includes an optical element region 11 in which an optical element is formed in a lower surface central portion of the optical member 10, and also includes a non-optical element region 12 in which no optical element is formed on the periphery of the optical element region 11 Note that no optical element is formed on the upper surface of the optical member 10, but regions corresponding to the optical element region 11 and the non-optical element region 12, when viewed from the upper surface, are defined as the optical element region 11 and the non-optical element region 12, respectively. The wire 13 is formed in the non-optical element region 12 on the upper surface of the optical member 10 in such a manner that it surrounds the periphery of the optical element region 11. By arranging the wire 13 in this manner, in a case where damage such as cracking occurs in the optical element region 11 of the optical member 10, the wire 13 breaks and fails to be conductive. Therefore, by monitoring the conducting state of the wire 13, damage such as cracking, in particular, spanning the optical element region 11, of the optical member 10 can be detected. On both ends of the wire 13, a conduction detection mechanism connection portion 14 that connects to a conduction detection mechanism described below is formed.

In FIG. 1, one side of the optical member 10 (square on the upper surface) is approximately 2 mm, one side of the optical element region (square) is approximately 1 mm, the thickness is approximately 300 μm, the total light transmittance is approximately 90%, and the haze is approximately 0.5%.

Figure 2:
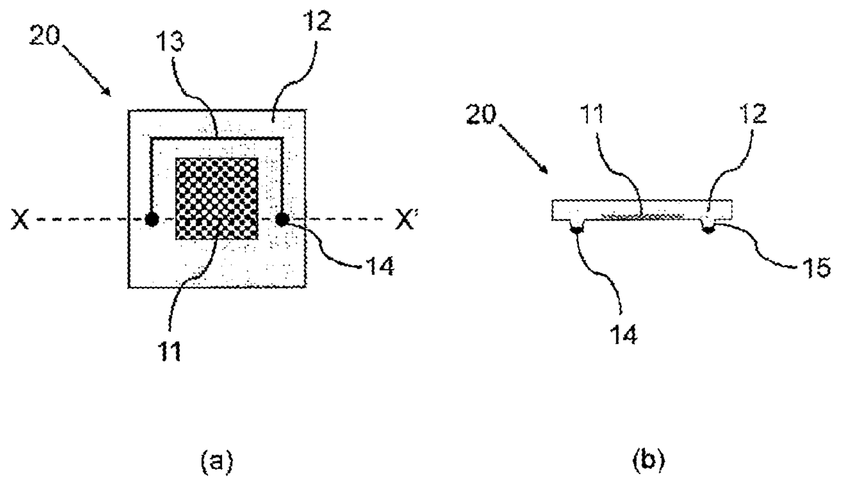
FIG. 2, diagram (a) and (b) are schematic diagrams illustrating another example of the preferred embodiment of the optical member of the present invention.
Figure 4:
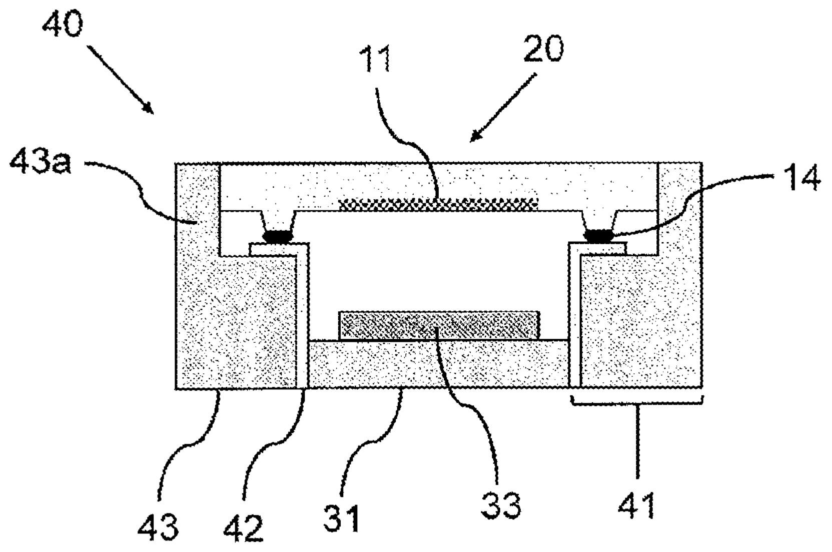
FIG. 4 is a schematic cross-sectional view illustrating another example of the preferred embodiment of the laser module of the present invention.

FIG. 2, diagrams (a) and (b) are schematic diagrams illustrating another example of the preferred embodiment of the optical member of the present invention. FIG. 2, diagram (a) is a top view, and FIG. 2, diagram (b) is a cross-sectional view taken along X-X'. The optical member 20 in FIG. 2 includes an optical element region 11 in which an optical element is formed in a lower surface central portion of the optical member 20, and also includes a non-optical element region 12 in which no optical element is formed on the periphery of the optical element region 11 The wire 13 is formed in the non-optical element region 12 on the lower surface of the optical member 20 in such a manner that it surrounds the periphery of the optical element region 11. In a case where cracking or the like occurs in the optical element region 11 of the optical member 20, the wire 13 breaks and fails to be conductive. Therefore, similarly to FIG. 1, by monitoring the conducting state of the wire 13, damage such as cracking, in particular, spanning the optical element region 11, of the optical member 10 can be detected. On both ends of the wire 13, a conduction detection mechanism connection portion 14 that connects to a conduction detection mechanism described below is formed. Additionally, the conduction detection mechanism connection portion 14 is formed on a tip end of a protrusion 15 protruding from the lower surface of the optical member 20. By forming the conduction detection mechanism connection portion 14 on the tip end of the protrusion 15, it is easily connected to the conduction detection mechanism, as illustrated in FIG. 4 described below.

[Surface Emitting Laser Light Source]

A laser module including the optical member according to an embodiment of the present invention includes a surface emitting laser light source as a light source. The surface emitting laser light source used in an embodiment of the present invention is not particularly limited, includes a Vertical Cavity Surface Emitting Laser (VCSEL) and a Vertical External Cavity Surface Emitting Laser (VECSEL) with a cavity external thereto, and is preferably VCSEL because it is commonly used in 3D sensing and low in cost.

The laser light emitted by the surface emitting laser light source may be visible light or ultraviolet light or infrared rays, but near infrared radiation having a wavelength of from 750 to 2500 nm, which is highly safe and often used in 3D sensing, is preferred. In particular, near infrared radiation having a wavelength of from 800 to 1000 nm which is not susceptible to environmental light such as sunlight is particularly preferred. The output light intensity is not particularly limited and can be selected appropriately according to the application and purpose.

[Laser Module]

The laser module according to an embodiment of the present invention includes the optical member according to an embodiment of the present invention and the surface emitting laser light source described above. Embodiments of the laser module according to an embodiment of the present invention are not particularly limited as long as it is arranged in such a manner that the laser light emitted from the surface emitting laser light source passes through the optical member (preferably, optical element region formed in the optical member). When the optical member includes an optical element, the laser light passing through the optical element region is controlled and shaped into uniform light, structural light, or the like.

Figure 3:
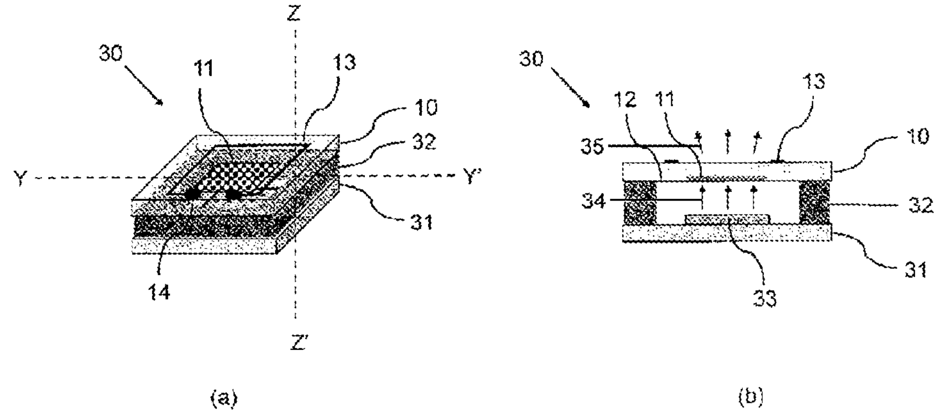
FIG. 3, diagram (a) and (b) are schematic views illustrating an example of a preferred embodiment of the laser module of the present invention.

FIG. 3, diagrams (a) and (b) are schematic views illustrating an example of a preferred embodiment of the laser module of the present invention. FIG. 3, diagram (a) is a perspective view, and FIG. 3, diagram (b) is a cross-sectional view taken along Y-Y' and Z-Z'. In a laser module 30 of FIG. 3, a surface emitting laser light source 33 such as VCSEL is arranged on a center upper portion of a substrate 31, and an optical member 10 is further arranged above the substrate 31 via a spacer 32. An optical element region 11 is arranged in the center portion of the lower surface of the optical member 10, and is in contact with the spacer 32 at an outer edge portion of a non-optical element region 12 in the lower surface. A wire 13 is formed in the non-optical element region 12 on an outer periphery of the upper surface of the optical member 10, and conduction detection mechanism connection portions 14 are formed on both ends of the wire 13, which connect to a conduction detection mechanism described below. Laser light 34 emitted by the surface emitting laser light source 33 passes through an optical element such as a microlens array or an optical diffraction grating in the optical element region 11 and is emitted from the laser module 30 as laser light 35 controlled and shaped into uniform or structural light.

In the event of cracking or other damage spanning the optical element region 11 of the optical member 10, the optical element in the optical element region 11 is unable to function normally. The laser light 34 is not sufficiently diffused in the optical element region 11, and is radiated from the laser module 30. Thus, defects or erroneous actuation may be caused in the laser device mounted with the laser module 30. In a case where damage such as cracking occurs in the optical element region 11 of the optical member 10, the wire 13 formed surrounding the optical element region 11 breaks and fails to be conductive. Accordingly, damage to the optical member 10 can be detected by monitoring the conducting state of the wire 13.

In addition to the optical member and the surface emitting laser, the laser module according to an embodiment of the present invention preferably further includes a conduction detection mechanism that detects a conducting state of the wire containing the electrically conductive substance, which is included in the optical member. The form of the conduction detection mechanism is not particularly limited as long as the conduction detection mechanism is capable of detecting the conducting state of the wire, but the form is preferably an aspect having an electrode connected to both ends of the wire.

FIG. 4 is a schematic cross-sectional view illustrating another example of the preferred embodiment of the laser module of the present invention. The laser module 40 in FIG. 4 has a configuration in which the optical member 20 in FIG. 2 is mounted on a conduction detection mechanism 41, and, further, a substrate 31 and a surface emitting laser light source 33 are arranged in the lower portion of the optical member 20. The conduction detection mechanism 41 includes a retainer 43 for holding the optical member 20 and an electrode 42 laminated on the retainer 43. The electrode 42 is not particularly limited as long as it is conductive, but is preferably made of copper. The retainer 43 has a protrusion 43*a* on an upper periphery thereof, and the optical member 20 is housed inside the retainer 43. The electrode 42 is stacked on the inner surface and the upper surface of the retainer 43, and the upper end of the electrode 42 is in contact with the conduction detection mechanism connection portion 14 of the optical member 20 and retains the optical member 20 from below. The lower end of the electrode 42 is connected with a conduction detector (not illustrated) with the other electrode to monitor the conducting state of the wire 13. When damage such as cracking occurs in the optical member 20, damage to the optical member 20 can be detected by detecting that the wire 13 breaks and fails to be conductive.

The laser module according to an embodiment of the present invention can be suitably used as a laser module for generating depth information in 3D sensing. Examples of the method for generating depth information include a Time of Flight (TOF) method, a structured light method, a stereo matching method, and a Structure from Motion (SfM) method. The TOF method is a method of irradiating a target space with near infrared radiation, receiving reflected light in an object in the target space, measuring a time from irradiation with the near infrared radiation until receiving the reflected light, and determining a distance to the object in the target space based on the time. Furthermore, the structured light method is a method of projecting a predetermined projection pattern of near infrared radiation on an object present in a target space, and detecting a shape (depth) of the object present in the target space on the basis of the state of deformation of the projection pattern. Furthermore, the stereo matching method is a method of determining a distance to a subject based on a parallax between two captured images of the subject captured from different positions. Furthermore, the SfM method is a method of performing depth detection by calculating a relationship between images, such as registration of feature points, using a plurality of captured images captured from different angles, and performing optimization.

[Laser Device]

The laser device according to an embodiment of the present invention includes the laser module according to an embodiment of the present invention.

The laser device according to an embodiment of the present invention includes the laser module according to an embodiment of the present invention, and thus can easily detect damage such as cracking, peeling, and the like of the optical member used in the laser module. Therefore, defects of the laser module caused by damage to the optical member and injuries caused by erroneous actuation can be prevented. Accordingly, the laser device according to an embodiment of the present invention can be suitably used in 3D sensing applications suited to such characteristics. For example, in face authentication of a smartphone, attention can be attracted by sending an error message to the user, or the laser light itself is not emitted, thereby preventing the user's eyes from being directly irradiated with the laser light and reducing a risk of blindness and the like. Also, in automatic driving of an automobile, defects in a 3D sensing system mounted with the laser module are detected, and error messages or the like are sent to the driver, thereby making it possible to prevent accidents caused by erroneous actuation. It can also be suitably used in any application using 3D sensing, such as a recognition camera for 3D mapping, a gesture recognition controller for a gaming device, automatic driving of an automobile, and machine vision in a plant.

Examples

Hereinafter, the present invention will be described in more detail based on examples, but the present invention is not limited by these examples.

Manufacture Example 1 (Manufacture of Optical Member Not Provided with Wire)

An epoxy resin (CELVENUS106; available from Daicel Co., Ltd.) (5 g) was added dropwise onto a disk-shaped silicone resin substrate in which 9×9 inversion patterns of diffractive optical elements were arranged in one section (2.5 mm in length×2.5 mm in width) with a diameter of 100 mm. The mold was closed, with the thickness of a flat silicone resin substrate having the same size being approximately 0.3 mm. UV irradiation was performed at 100 $mW/cm^2$×30 seconds. When the upper and lower silicone resin substrates were removed, an optical member in which 9×9 diffractive optical elements were arranged in one disk-shaped section (2.5 mm in length×2.5 mm in width) was obtained as a cured product of the epoxy resin.

Manufacture Example 2 (Manufacture of Optical Member Not Provided with Wire)

An epoxy resin (CELVENUS106; available from Daicel Co., Ltd.) (5 g) was added dropwise onto a disk-shaped silicone resin substrate in which 9×9 inversion patterns of diffractive optical elements were arranged in one section (2.5 mm in length×2.5 mm in width) with a diameter of 100 mm. The mold was closed, with the thickness of a flat glass substrate having the same size being approximately 0.3 mm. UV irradiation was performed at 100 $mW/cm^2$×30 seconds. When the silicone resin substrate on the lower mold was removed, an optical member was obtained in which a cured product layer of the epoxy resin in which 9×9 diffractive optical elements were arranged in one section (2.5 mm in length×horizontal 2.5 mm) was laminated on the glass substrate.

Manufacture Example 3 (Preparation of Surface-Modified Silver Nanoparticles)

Formation of Complex

Silver oxalate (molecular weight: 303.78) was obtained from silver nitrate (available from Wako Pure Chemical Industries, Ltd.) and oxalic acid dihydrate (available from Wako Pure Chemical Industries, Ltd.).

Then, 20.0 g (65.8 mmol) of the silver oxalate was charged to a 500-mL flask, 30.0 g of n-butanol was added to this, and an n-butanol slurry of silver oxalate was prepared.

To this slurry, an amine mixture liquid of 57.8 g (790.1 mmol) of n-butylamine (a molecular weight of 73.14, available from Daicel Corporation), 40.0 g (395.0 mmol) of n-hexylamine (a molecular weight of 101.19, available from Tokyo Chemical Industry Co., Ltd.), 38.3 g (296.3 mmol) of n-octylamine (a molecular weight of 129.25, trade designation "FARMIN 08D", available from Kao Corporation), 18.3 g (98.8 mmol) of n-dodecylamine (a molecular weight of 185.35, trade designation "FARMIN 20D", available from Kao Corporation), and 40.4 g (395.0 mmol) of N,N-dimethyl-1,3-propanediamine (a molecular weight of 102.18, available from Koei Chemical Co., Ltd.) was added dropwise at 30° C.

After the dropwise addition, the mixture was stirred at 30° C. for 2 hours to allow a complex forming reaction between silver oxalate and the amines to proceeded, and a white material (silver oxalate-amine complex) was obtained.

Thermal Decomposition

After the formation of the silver oxalate-amine complex, the reaction solution temperature was raised from 30° C. to approximately 105° C. (from 103 to 108° C.), then the silver oxalate-amine complex was thermally decomposed by heating for 1 hour in a state of maintaining the temperature, and a dark blue suspension in which surface-modified silver nanoparticles were suspended in the amine mixture liquid was obtained.

Washing

After cooling, 200 g of methanol was added to the resulting suspension, and the mixture was stirred. Then, the surface-modified silver nanoparticles were precipitated by centrifugation, and the supernatant was removed. Then, 60 g of methanol was added again, and the mixture was stirred, then the surface-modified silver nanoparticles were precipitated by centrifugation, and the supernatant was removed. Surface-modified silver nanoparticles in a wet state were thus obtained.

Manufacture Example 4 (Preparation of Silver Ink for Inkjet Printing)

The dispersion medium was mixed with the surface-modified silver nanoparticles obtained in Manufacture Example 3 to obtain a black brown silver ink for inkjet printing.

Example 1 (Inkjet Printing)

The silver ink for inkjet printing obtained in Manufacture Example 4 was filled into an inkjet printer, and a wire was printed on one side of the disk-shaped optical member obtained in Manufacture Example 1 in such a manner that it surrounded the periphery of each of the diffractive optical elements in which 9×9 sections (2.5 mm in length×2.5 mm in width for each section) were arranged. The optical member on which the wire was printed was sintered using a hot plate, and an optical member was obtained in which a wire having a thickness of approximately 1 μm and a width of approximately 50 μm was arranged in an array.

The optical member having the wire obtained in an array was singulated into an optical member having each of the wires using a dicing apparatus (DAD3350, available from DICSO) mounted with a dicing blade (available from DISCO) having a thickness of 0.1 μm.

Example 2 (Inkjet Printing)

The silver ink for inkjet printing obtained in Manufacture Example 4 was filled into an inkjet printer, and a wire was printed on the glass substrate surface of the disk-shaped optical member obtained in Manufacture Example 2 in such a manner that it surrounded the periphery of each of the diffractive optical elements in which 9×9 sections (2.5 mm in length×2.5 mm in width for each section) were arranged. The optical member on which the wire was printed was sintered using a hot plate, and an optical member was obtained in which a wire having a thickness of approximately 1 μm and a width of approximately 50 μm was arranged in an array.

The optical member having the wire obtained in an array was singulated into an optical member having each of the wires using a dicing apparatus (DAD3350, available from DICSO) mounted with a dicing blade (available from DISCO) having a thickness of 0.1 μm.

Example 3 (Screen Printing)

With silver paste ink (product name: NP-2910D1), available from Noritake Co., Ltd., a wire was printed on the glass surface of the disk-shaped optical member obtained in Manufacture Example 2 at 25° C. using a screen printing apparatus (LS-150TV, available from NEWLONG SEIMITSU KOGYO Co., Ltd.) in such a manner that it surrounded the periphery of each of the diffractive optical elements in which 9×9 sections (2.5 mm in length×2.5 mm in width for each section) were arranged. The optical member on which the wire was printed was sintered using a hot plate, and an optical member was obtained in which a wire having a thickness of approximately 1 μm and a width of approximately 50 μm was arranged in an array.

The optical member having the wire obtained in an array was singulated into an optical member having each of the wires using a dicing apparatus (DAD3350, available from DICSO) mounted with a dicing blade (available from DISCO) having a thickness of 0.1 μm.

Example 4 (Screen Printing)

With silver paste ink (product name: NP-2910D1), available from Noritake Co., Ltd., a wire was printed on one side of the disk-shaped optical member obtained in Manufacture Example 1 at 25° C. using a screen printing apparatus (LS-150TV, available from NEWLONG SEIMITSU KOGYO Co., Ltd.) in such a manner that it surrounded the periphery of each of the diffractive optical elements in which 9×9 sections (2.5 mm in length×2.5 mm in width for each section) were arranged. The optical member on which the wire was printed was sintered using a hot plate, and an optical member was obtained in which a wire having a thickness of approximately 1 vim and a width of approximately 50 μm was arranged in an array.

The optical member having the wire obtained in an array was singulated into an optical member having each of the wires using a dicing apparatus (DAD3350, available from DICSO) mounted with a dicing blade (available from DISCO) having a thickness of 0.1 μm.

Evaluation Test (Reflow Heat Resistance Test)

The conduction of the wire was confirmed by connecting the tester to both ends of the wire of the singulated optical member obtained in Example 1. The resistance value was 4.4Ω. Thereafter, the optical member was placed in a simple reflow furnace (available from Shinapex Co., Ltd.), and a heat resistance test based on the reflow temperature profile (maximum temperature: 260° C.) prescribed in JEDEC standard was applied three times sequentially, and then the conduction of the wire of the optical member after heat treatment by the reflow furnace was checked. The resistance value was 2.0Ω. As a result, it was confirmed that no damage such as cracks occurred in the optical member of Example 1 even after heat treatment using the reflow furnace.

Variations of embodiments of the present invention described above are additionally described below.

[1] An optical member for use in a laser module including a surface emitting laser light source, the optical member including a wire containing an electrically conductive substance.

[2] The optical member according to [1], wherein the optical member is formed from at least one type selected from the group consisting of plastic and inorganic glass.

[3] The optical member according to [1] or [2], wherein the optical member is plastic or a laminate of plastic and inorganic glass.

[4] The optical member according to [3], wherein the laminate is a laminate in which a plastic layer on which an optical element is formed is laminated on one side of a substrate made of flat inorganic glass.

[5] The optical member according to [3] or [4], wherein the plastic is a cured product of a curable epoxy resin composition.

[6] The optical member according to [5], wherein the curable epoxy resin composition contains a polyfunctional alicyclic epoxy compound.

[7] The optical member according to [6], wherein the polyfunctional alicyclic epoxy compound includes at least one type of compound selected from the group consisting of (i) to (iii) below:

a compound (i) including an epoxy group (an alicyclic epoxy group) constituted of two adjacent carbon atoms and an oxygen atom that constitute an alicyclic ring;

a compound (ii) including an epoxy group directly bonded to an alicyclic ring with a single bond; and a compound (iii) including an alicyclic ring and a glycidyl group.

[8] The optical member according to [7], wherein the compound (i) having an alicyclic epoxy group includes a compound represented by Formula (i) below:

[Chem. 9]

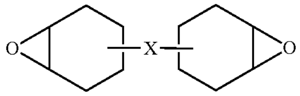
(i)

wherein X represents a single bond or a linking group (a divalent group having one or more atoms; and a substituent (for example, such as an alkyl group) may be bonded to a cyclohexene oxide group.

[9] The optical member according to [8], wherein the compound (i) includes (3,4,3',4'-diepoxy)bicyclohexyl.

[10] The optical member according to any one of [1] to [9], wherein the optical member includes an optical element (for example, a diffractive optical element, a microlens array, a prism, a polarizing plate, or the like).

[11] The optical member of any one of [1] to [10], wherein the optical member includes at least one type of optical element selected from the group consisting of a diffractive optical element and a microlens array.

[12] The optical member according to [10] or [11], wherein the optical member has a substrate shape and includes a region in which an optical element is formed (hereinafter, also referred to as "optical element region") and a region in which no optical element is formed (hereinafter, also referred to as "non-optical element region").

[13] The optical member according to [12], wherein the optical element region is formed in a center portion of the substrate of the optical member, and the non-optical element region is provided on the periphery of the optical element region (outer periphery of the substrate of the optical member).

[14] The optical member according to [12] or [13], wherein the wire is formed in the non-optical element region of the optical member.

[15] The optical member according to [13] or [14], wherein the wire is formed in the non-optical element region of the optical member in such a manner that it surrounds the periphery of the optical element region.

[16] The optical member according to any one of [1] to [15], wherein the wire has a width of not greater than 200 μm (for example, from 1 to 200 μm, and preferably from 10 to 100 μm).

[17] The optical member according to any one of [1] to [16], wherein the electrically conductive substance includes at least one type selected from the group consisting of a metal, a metal oxide, an electrically conductive polymer, and an electrically conductive carbon-based substance.

[18] The optical member according to any one of [1] to [17], wherein the electrically conductive substance includes a metal (e.g., gold, silver, copper, chromium, nickel, palladium, aluminum, iron, platinum, molybdenum, tungsten, zinc, lead, cobalt, titanium, zirconium, indium, rhodium, ruthenium, and alloys thereof).

[19] The optical member according to any one of [1] to [18], wherein the electrically conductive substance includes silver.

[20] A method for manufacturing the optical member described in any one of [1] to [19], the method including:

applying an ink containing an electrically conductive substance to an optical member by a printing process to form the wire.

[21] The method for manufacturing the optical member according to [20], wherein the printing process includes inkjet printing or screen printing.

[22] The method for manufacturing the optical member according to or

[21], wherein the ink containing the electrically conductive substance is an ink containing surface-modified metal nanoparticles having a configuration in which surfaces of the metal nanoparticles are coated with an organic protective agent (hereinafter, also referred to as "surface-modified metal nanoparticles").

[23] The method for manufacturing the optical member according to [22], wherein the surface-modified metal nanoparticles each consist of a metal nanoparticle portion and a surface modification portion that covers the metal nanoparticle portion, and the proportion of the surface modification portion is from 1 to 20 wt. % (preferably, from 1 to 10 wt. %) of the weight of the metal nanoparticle portion.

[24] The method for manufacturing the optical member according to [23], wherein the metal nanoparticle portion has an average primary particle diameter of from 0.5 to 100 nm (preferably from 0.5 to 80 nm, more preferably from 1 to 70 nm, and even more preferably from 1 to 60 nm).

[25] The method for manufacturing the optical member according to [23] or [24], wherein the metal that constitutes the metal nanoparticle portion is at least one type (preferably silver) selected from the group consisting of gold, silver, copper, nickel, aluminum, rhodium, cobalt, and ruthenium.

[26] The method for manufacturing the optical member according to any one of [22] to [25], wherein the organic protective agent that constitutes the surface modification portion of the surface-modified metal nanoparticle includes a compound having from 4 to 18 carbon atoms and having an amino group (an amine having from 4 to 18 carbon atoms).

[27] The method for manufacturing the optical member according to any one of [22] to [26], wherein the organic protective agent that constitutes the surface modification portion of the surface-modified metal nanoparticle contains, as amines, a monoamine (1) having 6 or more carbon atoms in total, and a monoamine (2) having 5 or less carbon atoms in total and/or a diamine (3) having 8 or less carbon atoms in total.

[28] The method for manufacturing the optical member according to any one of [20] to [27], wherein the optical member is an optical element array in which two or more optical elements are arranged two-dimensionally.

[29] The method for manufacturing the optical member according to [28], further including singulating the optical element array into the two or more optical elements by dicing.

[30] A laser module including the optical member described in any one of [1] to [19] and a surface emitting laser light source.

[31] The laser module according to [30], wherein laser light emitted by the surface emitting laser light source includes near infrared radiation having a wavelength of from 800 to 1000 nm.

[32] The laser module according to [30] or [31], further including a conduction detection mechanism for detecting a conducting state of the wire containing the electrically conductive substance, which is included in the optical member.

[33] The laser module according to [32], wherein the conduction detection mechanism includes an electrode connected to both ends of the wire.

[34] The laser module according to any one of [30] to [33], which is a laser module for generating depth information in 3D sensing.

[35] The laser module according to [34], wherein a method for generating depth information includes at least one type selected from the group consisting of a Time of Flight (TOF) method, a structured light method, a stereo matching method, and a Structure from Motion (SfM) method.

[36] A laser device including the laser module described in any one of [30] to [35].

[37] laser device according to [36], which is used in 3D sensing selected from the group consisting of face authentication of a smartphone, automatic driving of an automobile, recognition cameras for 3D mapping, gesture recognition controllers for gaming devices, and machine vision in a plant.

INDUSTRIAL APPLICABILITY

The optical member, laser module including the optical member, and laser device of the present invention can be suitably used in 3D sensing such as face authentication of a smartphone, automatic driving of an automobile, recognition cameras for 3D mapping, gesture recognition controllers for gaming devices, and machine vision in a plant.

REFERENCE SIGNS LIST

10, 20: Optical member
11: Optical element region
12: Non-optical element region
13: Wire containing electrically conductive substance
14: Conduction detection mechanism connection portion
30, 40: Laser module
31: Substrate
32: Spacer
33: Surface emitting laser light source
34: Laser light emitted from surface emitting laser light source
35: Laser light emitted from laser module
41: Conduction detection mechanism
42: Electrode
43: Retainer for optical member

The invention claimed is:

1. An optical member comprising:

a wire containing an electrically conductive substance and being disposed on one surface of the optical member in open-ended arrangement, wherein an area in which an optical element is formed on the same surface as the surface on which the wire is disposed, wherein the wire is disposed in the area in which the optical element is formed, wherein the optical element includes a plurality of sides, and wherein two ends of the wire face each other and are disposed adjacent to the same side of the plurality of sides of the optical member, or the two ends of the wire are disposed adjacent to a first side and a second side of the plurality of sides of the optical member, the first side is different from the second side, and the two ends of the wire face the same side of the plurality of the optical member.

2. The optical member according to claim 1, wherein the electrically conductive substance comprises a metal.

3. The optical member according to claim 1, wherein the electrically conductive substance comprises silver or gold.

4. The optical member according to claim 1, wherein the optical member comprises at least one type of optical element selected from the group consisting of a diffractive optical element and a microlens array.

5. The optical member according to claim 1, wherein the optical member is plastic or a laminate of plastic and inorganic glass.

6. The optical member according to claim 5, wherein the plastic is a cured product of a curable epoxy resin composition.

7. The optical member according to claim 1, wherein the optical member includes an inorganic glass.

8. A method for manufacturing the optical member described in claim 1, the method comprising:

applying an ink containing an electrically conductive substance to an optical member by a printing process to form the wire.

9. The method for manufacturing the optical member according to claim 8, wherein the printing process includes inkjet printing or screen printing.

10. The method for manufacturing the optical member according to claim 8, wherein the optical member is an optical element array in which two or more optical elements are arranged two-dimensionally.

11. A laser module comprising:

an optical member including: a wire containing an electrically conductive substance and being disposed on one surface of the optical member in open-ended arrangement, wherein an area in which an optical element is formed on the same surface as the surface on which the wire is disposed, wherein the wire is disposed in the area in which the optical element is formed, wherein the optical element includes a plurality of sides, and wherein two ends of the wire face each other and are disposed adjacent to the same side of the plurality of sides of the optical member, or the two ends of the wire are disposed adjacent to a first side and a second side of the plurality of sides of the optical member, the first side is different from the second side, and the two ends of the wire face the same side of the plurality of the optical member.

12. The laser module according to claim 11, comprising: a surface emitting laser light source is configured to emit a laser light toward a second surface of the optical member opposite to a first surface of the optical member.

13. A laser device comprising the laser module described in claim 11.

14. The laser module according to claim 11, wherein the electrically conductive substance comprises a metal.

15. The laser module according to claim 11, wherein the electrically conductive substance comprises silver or gold.

16. The laser module according to claim 11, wherein the optical member comprises at least one type of optical element selected from the group consisting of a diffractive optical element and a microlens array.

17. The laser module according to claim 11, wherein the optical member is plastic or a laminate of plastic and inorganic glass.

18. The laser module according to claim 11, wherein the optical member includes an inorganic glass.

19. The optical member according to claim 1, wherein the wire has, at both ends thereof, a conduction detection mechanism connection portion that connects to a conduction detection mechanism.

20. The laser module according to claim 11, wherein the wire has, at both ends thereof, a conduction detection mechanism connection portion that connects to a conduction detection mechanism.

* * * * *